(12) United States Patent
Jiao et al.

(10) Patent No.: US 8,568,871 B2
(45) Date of Patent: Oct. 29, 2013

(54) MONO-LAYER AND MULTI-LAYER NANOWIRE NETWORKS

(75) Inventors: Jun Jiao, Beaverton, OR (US); Haiyan Li, Portland, OR (US)

(73) Assignee: State of Oregon acting by and through the State Board of Higher Education on behalf of Portland State University, Portland, OR (US)

( * ) Notice: Subject to any disclaimer, the term of this patent is extended or adjusted under 35 U.S.C. 154(b) by 1305 days.

(21) Appl. No.: 12/290,287

(22) Filed: Oct. 28, 2008

(65) Prior Publication Data

US 2009/0142558 A1 Jun. 4, 2009

Related U.S. Application Data

(60) Provisional application No. 61/000,995, filed on Oct. 29, 2007.

(51) Int. Cl.
*B05D 5/00* (2006.01)
*B05D 7/00* (2006.01)

(52) U.S. Cl.
USPC ........... 428/332; 428/221; 428/364; 428/401; 977/762; 427/180; 427/197

(58) Field of Classification Search
USPC .................. 977/762; 428/221, 332, 364, 401; 427/180, 197
See application file for complete search history.

(56) References Cited

PUBLICATIONS

Ouyang et al., "Catalyst-Assisted Solution-Liquid-Solid Synthesis of CdS/CdSe Nanorod Heterostructures," J.Am.Chem.Soc. published online Dec. 15, 2006.*
Ma et al., "Synthesis of CdS nanowire networks and their optical and electrical properties," Nanotechnology 18 2007, published Apr. 23, 2007.*
Dong et al., "Synthesis, Characterization, and Growth Mechanism of Self-Assembled Dendritic CdS Nanorods," *J Phys. Chem. B* 108(5):1617-1620, 2004.
Hsin et al., "Lateral Self-Aligned p-Type $In_2O_3$ Nanowire Arrays Epitaxially Grown on Si Substrates," *Nano Letters* 7(6):1799-1803, 2007.
Law et al., "Semiconductor Nanowires and Nanotubes," *Annu. Rev. Mater. Res.* 34:83-122, 2004.
Patolsky et al., "Nanowire-Based Biosensors," *Analytical Chemistry*, pp. 4261-4269, Jul. 1, 2006.

(Continued)

*Primary Examiner* — Matthew Matzek
(74) *Attorney, Agent, or Firm* — Klarquist Sparkman, LLP

(57) ABSTRACT

Disclosed is a method for nanostructure synthesis that includes growing nanostructures on a layered structure compound at a low temperature using a solution containing a solvent and at least one precursor. The method can include synthesizing and assembling nanowires in essentially the same method step. Disclosed nanostructures and nanowires are substantially uniform in diameter and single crystal. Nanowires can intersect to form networks and can be covalently bonded at points of intersection. Disclosed nanowire networks can be substantially uniform and can form an ordered network. Nanowire networks can be used to fabricate electronic and optical devices.

27 Claims, 27 Drawing Sheets

(56) References Cited

PUBLICATIONS

Peng et al., "Formulation of High-Quality CdTe, CdSe, and CdS Nanocrystals Using CdO as Precursor," *Journal of the American Chemical Society* 102(1):183-184, 2001.

Ramanath et al., "Templateless Room-Temperature Assembly of Nanowire Networks from Nanoparticles," *Langmuir* 20(13):5583-5587, 2004.

Shen et al., "CdS Multipod-Based Structures through a Thermal Evaporation Process," *Crystal Growth & Design* 5(3):1085-1089, 2005.

Sigman et al., "Solventless Synthesis of $Bi_2S_3$ (Bismuthinite) Nanorods, Nanowires and Nanofabric," *Chem. Mater.* 17(7):1655-1660, 2005.

Sohn et al., "Direct Observation of Structural Component of the Metal-Insulator Phase Transition and Growth Habits of Epitaxially Grown $VO_2$ Nanowires," *Nano Letters* 7)6):1570-1574, 2007.

Trentler et al., "Solution-Liquid-Solid Growth of Crystalline III-V Semiconductors: An Analogy to Vapor-Liquid-Solid Growth," *Science* 270:1791-1794, Dec. 15, 1995.

Uchiyama et al., "Tin Oxide Meshes Consisting of Nanoribbons Prepared through an Intermediate Phase in an Aqueous Solution," *Crystal Growth & Design* 7(5):841-843, 2007.

Wang et al., "Solution-Based Synthetic Strategies for 1-D Nanostructures," *Inorganic Chemistry* 45(19):7522-7534, 2006.

Wang et al., "Metal and Semiconductor Nanowire Network Thin Films with Hierarchical Pore Structure," *Chemical Materials* 18(18):4231-4237, 2006.

Xia et al., "One-Dimensional Nanostructures: Synthesis, Characterization and Applications," *Advanced Materials* 15(5):353-389, Mar. 4, 2003.

Zhou et al., "Three-Dimensional Tungsten Oxide Nanowire Networks," *Advanced Materials* 17:2107-2110, 2005.

Zhu et al., "Hyperbranched Lead Selenide Nanowire Networks," *Nano Letters* 7(4):1095-1099, 2007.

\* cited by examiner

FIG. 48
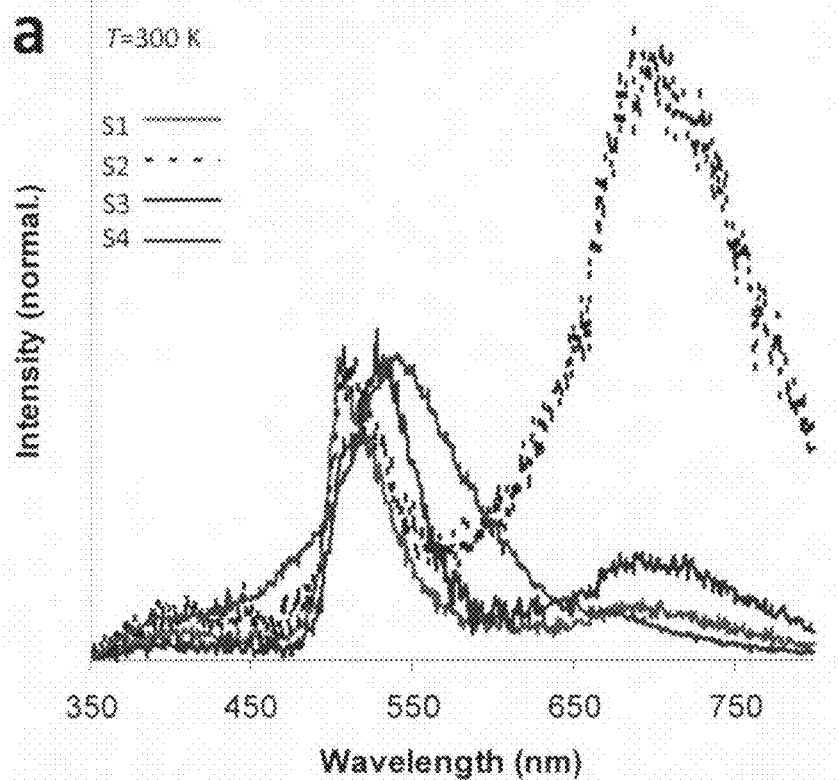
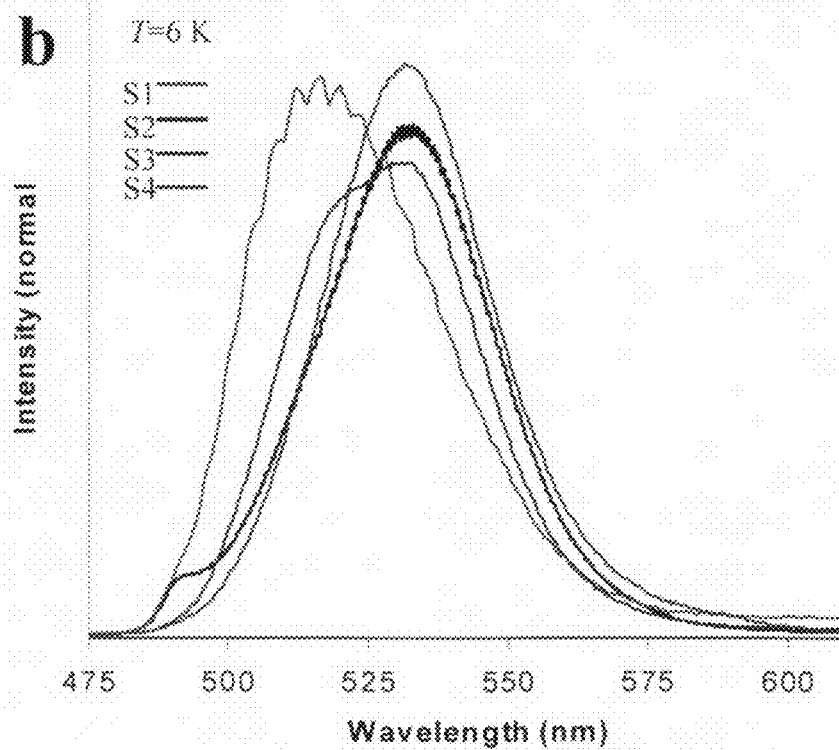

MONO-LAYER AND MULTI-LAYER NANOWIRE NETWORKS

CROSS REFERENCED TO RELATED APPLICATION

This application claims the benefit of the earlier filing date of U.S. provisional patent application No. 61/000,995, entitled Mono-Layer and Multi-Layer Nanowire Networks, which was filed on Oct. 29, 2007, and is incorporated herein by reference.

ACKNOWLEDGMENT OF GOVERNMENT SUPPORT

This invention was made with Government support under Grant No. ECCS-0217061, Grant No. ECCS-0348277, and Grant No. ECCS-0520891 awarded by the National Science Foundation. The United States government has rights in this invention.

FIELD

The present application is directed to the field of nanostructures, for example nanowires, nanowire networks, and methods of nanostructure synthesis.

BACKGROUND

One-dimensional nanowires and nanotubes have been used to fabricate nanodevices such as transistors, nano biosensors, nano lasers, solar cells, and nano generators. Frequently, a nanodevice is fabricated from either a single nanowire or from a nanowire array that is assembled by complicated, multi-step nanofabrication processes. The practical application of these devices is limited by a need for methods for the mass production of nanostructures with uniform structure, composition, and electronic or optical properties. In the context of nanodevice fabrication, theoretical studies have suggested that when one-dimensional nanostructures are connected covalently, the resulting assembly is expected to possess mechanical, electronic, and porosity properties that are different from those of isolated one-dimensional building blocks. Such properties may play an important role in minimizing the size of devices while retaining good performance under low voltage consumption.

Mass production of some nano- and micro-devices requires tailoring nanostructures into networks. Nanowire networks have been synthesized using thermal evaporation and deposition at high temperatures which are not favorable for device integration. It is evident that there is a need to develop new methods for the synthesis of one-dimensional nanostructures and for the assembly of nanostructures into two-dimensional ordered superstructures or complex functional architectures that are favorable to large-scale production and device integration.

SUMMARY

One aspect of the present disclosure includes a method for synthesizing nanostructures. One embodiment of this method for synthesizing nanostructures includes providing a substrate having a layered structure compound on a surface of the substrate, contacting the substrate with a solvent and a precursor solution, and forming a plurality of nanostructures on a surface. The nanostructure synthesis occurs at low temperatures and nanostructures can be synthesized and assembled in the same process step. In some examples, the solvent is a non-polar organic solvent. In some examples, the layered structure compound has polar bonds aligned along its surface.

Disclosed nanostructures may be nanowires and disclosed nanowires may form nanowire networks that may be mono-layer, multi-layer, or three dimensional. Exemplary nanostructures are substantially uniform and single crystal. Nanowires intersecting to form a network can be covalently bonded at intersection points. In some examples, nanowires are arranged in an ordered pattern. In some examples, nanowire networks form from substantially perpendicular, intersecting nanowires.

The foregoing and other objects, features, and advantages will become more apparent from the following detailed description, which proceeds with reference to the accompanying figures.

BRIEF DESCRIPTION OF THE DRAWINGS

FIG. 48 is normalized photoluminescence spectra for Samples N-Q at (a) 300 K and (b) 6 K.

DETAILED DESCRIPTION

Figure 1:
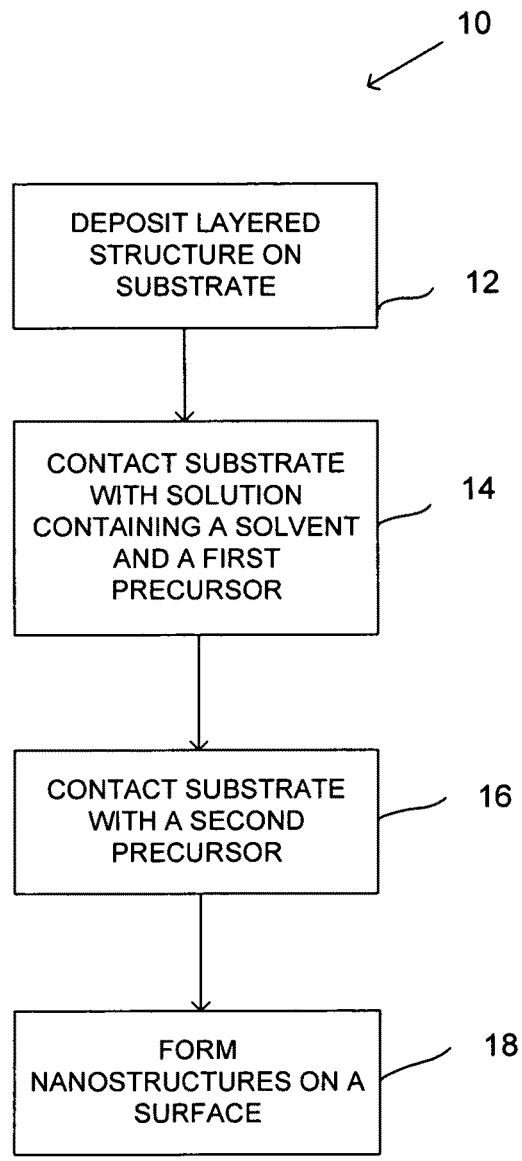
FIG. 1 is a flowchart of a method for nanostructure synthesis.

As used in this application and in the claims, the singular forms "a," "an," and "the" include the plural forms unless the context clearly dictates otherwise. Additionally, the term "includes" means "comprises." Further, the term "coupled" means electrically, electromagnetically, or optically coupled or linked and does not exclude the presence of intermediate elements between the coupled items.

The described systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

As used herein, a "nanowire" is a nanostructure that is longer than it is wide. Nanowires can have a range of lengths and diameters. In some embodiments, nanowires have an average length between about 50 nm and about 50 µm, such as between about 100 nm and about 10 µm. In some examples, nanowires can have an average length greater than 10 µm, such as between about 10 µm and 100 µm. Nanowires can have an average diameter between about 10 nm and about 500 nm, such as between about 20 nm and about 200 nm. A nanowire has an aspect ratio (i.e. a ratio of the structure length to the structure width) that is greater than 1 and typically greater than about 5, such as between about 5 and about 100. In some embodiments, nanowires have an aspect ratio larger than 100, such as between about 100 and 10,000. In some examples, nanowires have an aspect ratio larger than 10,000.

As used herein, a "network" is a plurality of connected nanostructures, such as two or more connected nanostructures. A nanowire network is a plurality of connected nanowires, such as two or more connected nanowires, or four or more connected nanowires. In some embodiments, a network is two or more connected nanowires arranged in an ordered pattern. For example, an ordered network of nanowires can include a plurality of connected pairs of nanowires such that a property of a connected pair of nanostructures is repeated in the plurality of connected pairs. In some embodiments of ordered networks, a pair of nanowires can be connected at substantially a 90° angle and other connected pairs in the network are also connected at substantially a 90° angle. For example, a network of nanowires arranged in a square grid pattern is an ordered nanowire network. Ordered nanowire networks can be formed from nanowires that are aligned or arranged in a readily apparent pattern that may or may not be square. For example, a network of nanowires arranged in a triangular grid pattern is an ordered nanowire network. In some examples, intersecting nanowires can intersect at substantially a 60° angle. Networks of nanostructures and networks of nanowires are not necessarily ordered.

A method of nanostructure synthesis 10 is illustrated in FIG. 1. Method 10 is typically performed at atmospheric pressure. With regard to FIG. 1, at 12, a layered structure compound is deposited on the surface of a substrate. Method 10 is independent of the substrate material because the layered structure compound typically does not bond or react with the substrate. Therefore, the substrate can be any solid surface which is stable at the reaction temperature of method 10 and in the solutions used in the method 10. For example, a substrate that is stable at temperatures less than about 300° C. and in an organic solvent is preferred. Typical materials used as a substrate include Si, $SiO_2$/Si, or glass. Examples of additional substrates include, without limitation: GaN, $SiN_x$, SiC, GaAs, ITO, Au, W, Pt, Fe, Al, and combinations thereof.

The layered structure compound can provide a template for nanostructure growth. The structure, concentration, and thickness of the deposited layer structure compound can be changed to modify the nanostructure growth. In some examples, increasing the concentration of the deposited layered structure compound produces dense nanowire networks. In some examples, polar bonds aligned on a surface of a layered structure compound can assist in the alignment of growing nanostructures. Layered structure compounds such as $BiI_x$ (where x=0-3), $CdI_2$, and $PbI_2$ are generally suitable. $BiI_3$ may be particularly suitable because of its rhombohedral structure. The layered structure compound can be in the form of flakes. Such layered structure compounds can typically be dissolved at low temperatures because the flakes are not covalently bonded to each other.

In a step 14, the substrate with the deposited layered structure compound is contacted with a solution comprising a solvent and a first precursor. Typically, the solvent is a non-polar organic solvent with long carbon atom chains, such as $C_xH_{2x+2-2y-z}O_yCl_z$ (where x=12-60, y=0-4, and z=0-6). Typical examples of a first precursor compound include, without limitation: $Pb(Ac)_2$, $Pb(Cl)_2$, $Pb(NO_3)_2$, $PbSO_4$, $Cd(Ac)_2$, $Cd(Cl)_2$, $Cd(NO_3)_2$, and $CdSO_4$. For example, the solution of step 14 containing a solvent and a first precursor may be a $Cd(Ac)_2 \cdot 2H_2O/C_{32}H_{66}$ mixture when forming CdX nanostructures, where X may be S or Se. In a step 16, the substrate is contacted with a second precursor. Examples of the second precursor include, without limitation: S—R (where $R=C_nH_m$ and n,m=1-12), S, Se, and Te. In some embodiments, the second precursor is sulfur or selenium powder when the first precursor is $Cd(Ac)_2$.

Typically, the second precursor is added to the solution created in step 14 which is already in contact with the substrate. Steps 14 and 16 may also be performed simultaneously by contacting the substrate with a solution containing a solvent, a first precursor, and a second precursor. For example, the substrate is contacted with a $Cd^{2+}/S/C_{32}H_{66}$ mixture when forming CdS nanostructures. The first and second precursors can be chosen such that synthesized nanostructures are conductors or semiconductors. In some embodiments, nanostructures may include Group II-VI semiconductors, Group IV semiconductors, Group III-V semiconductors, or combinations thereof. For example, nanostructures can include CdO, ZnO, CdS, CdSe, CdTe, ZnS, ZnSe, ZnTe, PbO, PbS, PbSe, PbTe, $Bi_2S_3$, $Bi_2Se_3$, Au, Ag, Pb, Ge, Si, or combinations thereof.

In a step 18, nanostructures are formed on the surface of the layered structure compound. Nanostructure growth can occur without a catalyst. Therefore, no catalyst material needs to be present in the solution or in contact with the layered structure compound to catalyze nanostructure growth. The nanostructures can be individual nano-sized particles or nanowires. In some embodiments, nanowires intersect to form a network. In some examples of nanowire networks, nanowires form covalent bonds at points of intersection. In some of these examples, intersecting nanowires form substantially simultaneously. That is, the intersecting nanowires can be synthesized and assembled in the same method step. For example, intersecting nanowires may form in the same solution as a result of performing steps 14 and 16. Nanowire network structure and orientation are typically based the structure and orientation of the layered structure compound. In some embodiments, the layered structure compound can assist in the formation of nanowire networks that are substantially planar and ordered.

Nanostructures, nanowires, and nanowire networks can be analyzed using methods of scanning electron microscopy (SEM), transmission electron microscopy (TEM), scanning transmission electron microscopy (STEM), energy-dispersive X-ray (EDX) spectroscopy, X-ray diffractometry (XRD), high resolution transmission electron microscopy (HRTEM), infrared (IR) spectroscopy, and selected area diffraction (SAD) capability, for example.

Nanowire network complexity, nanowire arrangement, nanowire size and density, nanostructure morphology, nanostructure constituent stoichiometry, and other nanostructure properties are based at least partially on reaction temperature, reaction time, precursor concentration, and layered structure compound concentration.

The synthesis steps 14, 16 and 18 are performed at a temperature less than about 300° C., and preferably between about 150° C. and about 280° C. Typically, nanostructure growth occurs at a temperature between about 160° C. and about 220° C. In some examples, pyramid-shaped particles tend to grow on the layered structure compound template at lower reaction temperatures, such as at about 160° C. In other examples, the formation of nanowires and networks of nanowires tends to be at reaction temperatures in the range between about 160° C. and about 190° C. A reaction temperature of between about 180° C. and about 190° C. such as about 185° C. may be particularly suitable for the formation of nanowire networks such as CdS or CdSe nanowire networks. A reaction temperature of between about 165° C. and about 175° C. such as about 170° C. may be preferred for the formation of nanowire networks with nanowires of a relatively large diameter.

A length of time that the substrate is in contact with the precursor solution is generally referred to as the reaction time. In method 10, the substrate is generally kept in contact with a precursor solution until the nanostructures are sufficiently synthesized. Sufficient synthesis may depend on the size, density, chemical composition of desired nanostructures. In some embodiments, long nanowires arranged in dense networks may be desired. In such embodiments, a long reaction time is generally preferred. The reaction time can be from about 0.5 hours to about 72 hours, and typically from about 3 to about 48 hours. In some embodiments, the reaction time can be longer than 72 hours. Typically, size and complexity of nanostructures and networks depend on the reaction time. For example, increasing reaction time may produce networks that are more complex with more nanowire intersections or with multiple layers. Therefore, the reaction time can be based on the desired nanostructure size or network complexity. The reaction time may also be determined based on a rate at which a template decomposes.

Properties of nanostructures and embodiments of the disclosed method can also depend on a precursor concentration. Precursor concentration can be adjusted during nanostructure growth by adding precursor concentration solution with different concentrations. For example, increasing the concentration of nanowire precursors in the nanowire precursor solution may reduce the reaction time to form nanowires of a particular average diameter or to form nanowire networks of a particular complexity. In some embodiments, a high precursor concentration results in long, highly dense nanostructures. In these embodiments, decreasing the precursor concentration decreases the density and the average length of formed nanostructures. In some embodiments, changing a concentration of a second precursor can be used to tune constituent stoichiometry of nanostructures. In an aspect of these embodiments, a low second precursor concentration is provided during the reaction to "starve" growth of nanostructures comprising the second precursor. For example, providing a low concentration of a sulfur precursor in a cadmium precursor solvent solution can result in a short period of CdS nanostructure growth followed by CdO nanostructure growth. In some embodiments, incremental changes in a nanowire precursor concentration can tune nanostructure growth orientation between substantially horizontal and substantially vertical.

Properties of disclosed nanostructures can also depend on a layered structure compound concentration. A layered structure compound concentration can be changed by changing the concentration of a layered structure compound in a solution used to deposit the layered structure compound onto a substrate. In some embodiments, a super-saturated solution of a layered structure compound can be formed. In some of these embodiments, highly concentrated flakes form in the super-saturated solution and can be deposited as a layered structure compound template onto a substrate surface. In other embodiments, a solution containing a layered structure compound can be spin-coated onto a substrate one or more times to change a layered structure compound concentration on the substrate. In some embodiments, high concentrations of a layered structure compound on a substrate surface can produce densely arranged nanostructures and nanowires with larger diameters.

Figure 2:
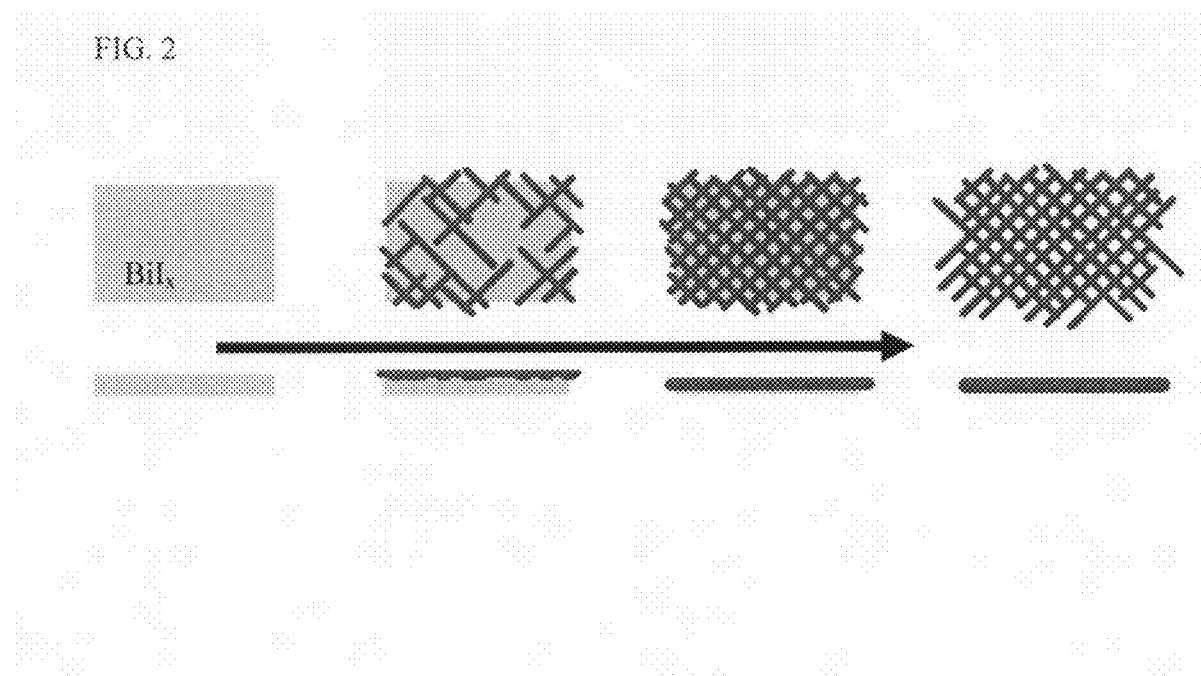
FIG. 2 is a schematic diagram illustrating typical nanowire network growth as the reaction time is increased.

A typical growth process of a nanowire network based on an embodiment of the method 10 is illustrated in FIG. 2. FIG. 2 illustrates the growth process for nanowire networks with the assistance of a $BiI_x$ template. As illustrated, reaction time increases along the direction of the arrow, from left to right. The top row of illustrations show a top-down view of a substrate while the bottom row of illustrations show a cross-sectional view of the substrate. As the reaction time increases, the number of nanowires and the length of the nanowires both increase. At shorter reaction times, the nanowires form predominantly on a layered compound template and may form independent nanowires. At increased reaction times, the nanowires begin to intersect to form networks. The size of these networks is based on the size of the layered structure compound flake deposited on the substrate surface. At long enough reaction times, the nanowires grow epitaxially beyond the size of the template.

Figure 3:
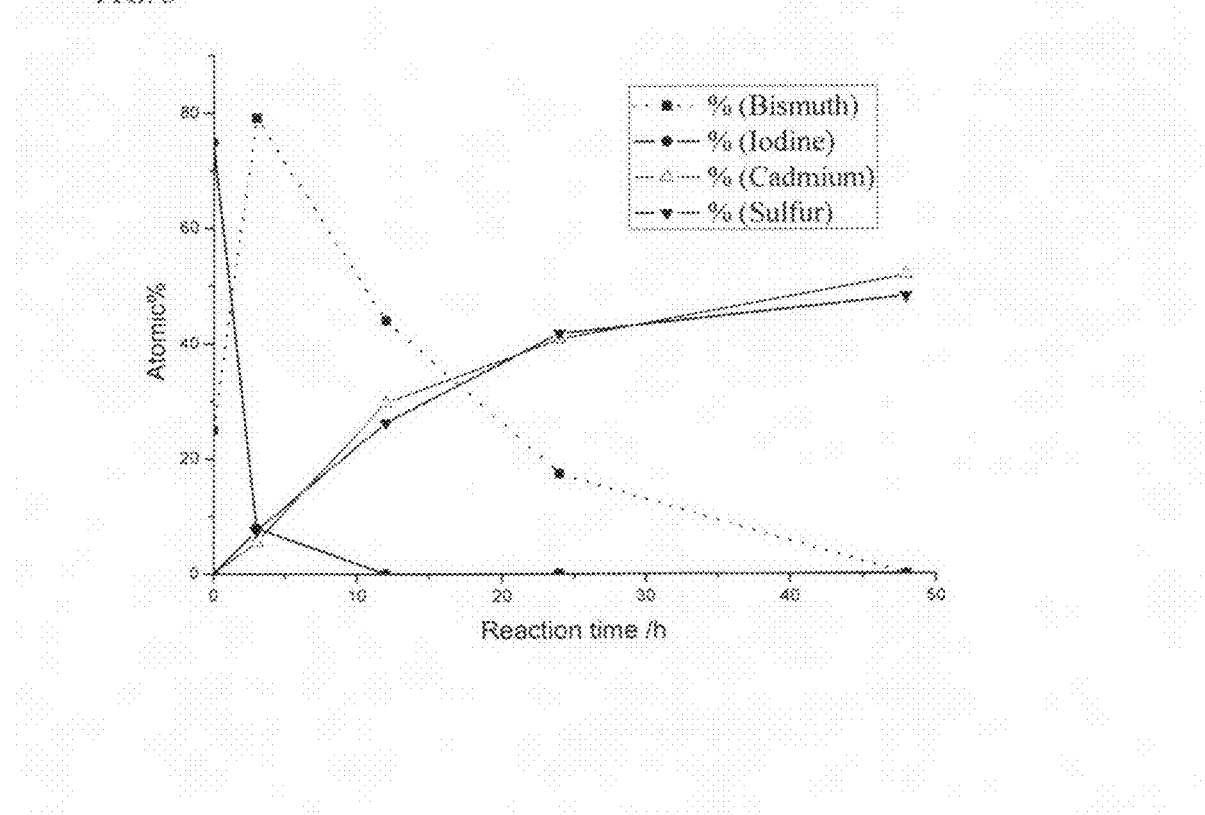
FIG. 3 is a plot of the atomic percentage of bismuth, iodine, cadmium, and sulfur as a function of the reaction time.

As shown in the bottom row of images of FIG. 2, the layered structure template can dissolve or decompose during nanowire synthesis. Therefore, longer reaction times may produce nanowires substantially free from the materials of the layered structure compound. For example, FIG. 3 is a plot of the relationship between the reaction time and the chemical composition of CdS nanowire networks on a $BiI_3$ template at a reaction temperature of 185° C. The data presented in FIG. 3 was obtained using energy dispersive X-ray (EDX) spectrometry analyses of CdS nanowires. FIG. 3 shows that the atomic percentages of elemental compositions of bismuth and of iodine tend to decrease as the reaction time increases. Likewise, the atomic percentages of cadmium and sulfur tend to increase. In this example, complete decomposition of $BiI_3$ flakes may take up to 48 hours at a reaction temperature of 185° C.

Nanowires and nanowire networks fabricated using low temperature chemical processes known in the art tend to vary broadly in structure and in quality depending on the process. Typically, these processes produce nanowires or nanowire networks that are substantially non-uniform with poor quality of crystallinity. Disclosed embodiments of a method for synthesizing nanostructures address these disadvantages and provide other advantages. For example, embodiments of the disclosed method can occur at a low temperature and can produce nanostructures that are substantially uniform and single crystal. Embodiments of the disclosed method can be substantially substrate independent and can be capable of producing a high yield of nanostructures.

Disclosed nanowires can be substantially uniform in diameter and have an average diameter typically ranging from about 20 nm to about 300 nm. In some examples, the average diameter ranges from about 30 nm to about 50 nm, while in other examples the average diameter of the nanowires can be between about 125 nm and about 225 nm. Nanowires forming nanowire networks typically have substantially uniform diameters. Disclosed nanowires can be substantially straight. The nanostructures and nanowires may contain semiconductive or conductive materials.

Disclosed nanowire networks contain one or more intersecting nanowires. Nanowire networks can be mono-layer, multi-layer, planar, or three-dimensional. Nanowire networks can form in layers and in various orientations based on an orientation or position of a layered template. In some examples, the nanowire networks are covalently bonded where nanowires intersect. Intersecting nanowires may be synthesized during substantially the same method step. In some embodiments, the nanowire networks are ordered or the nanowires form an ordered pattern. For example, nanowires can form angles that are substantially 90° such as in a square grid network pattern. A three-dimensional nanowire network may contain two-dimensional networks that are oriented vertically or otherwise non-parallel relative to other networks. In some embodiments of the method 10, portions of the layered structure compound can be deposited on the surface substantially vertical to the substrate surface, or otherwise non-parallel to the substrate. Because nanostructures tend to grow based on an orientation of the layered structure compound, two-dimensional nanowire networks formed on such a template can intersect to form three-dimensional networks.

Multi-layer nanowire networks include more than one layer of nanowire networks. Each layer of nanowire networks may be oriented in substantially the same manner, or the layers may be oriented differently. In an example embodiment of the method 10, multiple layers of a layered template may react with precursors to form multi-layered networks. For example, in the method 10, the orientations of the nanowire network layers tend to correspond to the orientations of different flake layers in the layered structure template. For a particular reaction temperature and precursor concentration, longer reaction times tend to produce more multi-layer nanowire networks, while shorter reaction times tend to produce mostly mono-layer networks. Multiple layers may form substantially simultaneously while the layer structure template is in contact with the nanowire precursor solution. That is, the synthesis and assembly of nanowires networks into three-dimensional or multi-layer networks can occur during the same method step.

Disclosed nanostructures and embodiments of a method for nanostructure synthesis can be used in various applications such as in the fabrication of various nano-devices. Various properties of the nanostructures, nanowires, and nanowire networks described herein may be altered by methods known to those of ordinary skill in the art to customize them for use in particular device applications. For example, nanostructures and nanowires may be annealed or doped to change their material, electronic, and optical properties. The size and structure of nanowire networks may also be changed by methods of micro-machining, such as by focused ion beam, electron beam, and focused laser beam ablation. For example, a portion of a nanowire or a nanowire network may be removed using focused ion beam milling. Nanostructure arrangement can be altered by manipulating the growth of the nanostructures by controlling the deposition of a layered structure compound template. For instance, the size and orientation of nanowire networks can be based on the size and orientation of a template flake or on the orientation of multiple layers of flakes. Nanostructures and nanowire networks may also be processed using CMOS technology to create various nanoscale devices. For example, post-synthesis lithography or other nanofabrication techniques may be used to add bonding pads, electrodes, or other electrical connections to the nanowire networks. Nanowire networks synthesized by the methods described herein may also be combined with nanowires, nanostructures, or devices fabricated using methods not described.

Features of the described nanostructures and of the described methods of nanostructure synthesis, such as low temperature synthesis and simultaneous nanostructure synthesis and assembly, make them suitable for large-scale bottom-up fabrication of integrated electronic and optical nanodevices. Such devices include, for example, transistors, nano-biosensors, nano-lasers, solar cells, flexible circuits, organic displays, high-density electronic devices, and nano-generators. These and other nanoelectronic and nanooptic applications utilizing nanowire networks and ordered nanostructures have numerous practical applications.

In an exemplary device embodiment, crossed nanowires create nano-scale circuits that are useful in electronic devices containing integrated circuits or combinational logic. For example, FIGS. 51A through 51D illustrate example logic circuits 30 and 40 created from a nanowire network 20. Nanowire network 20 is formed from several nanowires intersecting at substantially a 90° and the nanowires are covalently bonded at intersection points. The nanowire network 20 may be synthesized using methods presented herein. Several portions of the nanowires in the network 20 are cut or connected (i.e. with a focused ion beam) to create a customized nanowire network, such as nanowire network 22 illustrated in FIG. 51B.

Figure 51A:
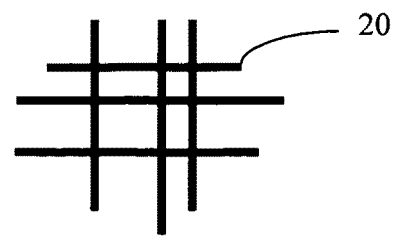
FIG. 51A is an elevational view of a nanowire network.
Figure 51B:
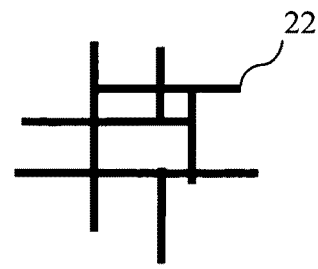
FIG. 51B is an elevational view of the nanowire network of FIG. 51A that has been micro-machined to remove portions of the network.
Figure 51C:
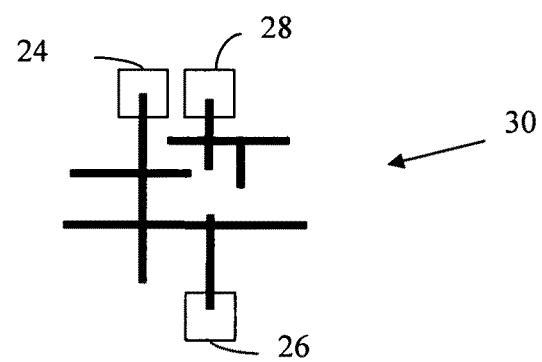
FIG. 51C is an elevational view of the nanowire network of FIG. 51A which has been processed to create a static logic circuit.

Using standard nanofabrication techniques known to those of ordinary skill in the art, bonding pads or electrodes 24, 26, and 28 are patterned onto a customized nanowire network, as illustrated in FIG. 51C. Bonding pads 24, 26, and 28 include a conductive material and can be wire-bonded or otherwise connected to electronics outside the network 22. Bonding pads 24, 26, and 28 are in electrical contact with nanowires in the customized nanowire network. The circuit 30 in FIG. 51C functions as a static logic circuit for inputs connected at 24 and 28 and an output connected at 26. The logic function is a result of the customized connections of the nanowire network. Logic circuit 30 can be used in various devices that require static logic or where nano-scale circuitry would be particularly suitable.

Figure 51D:
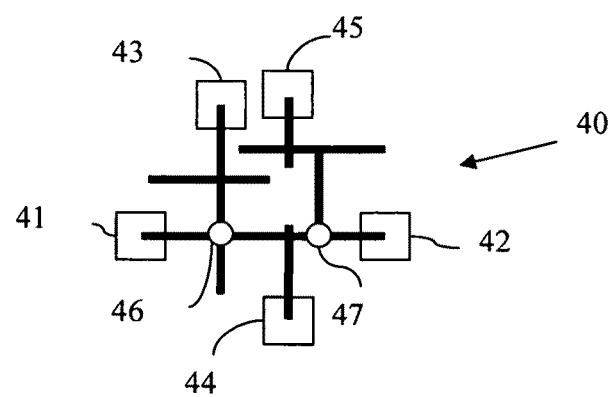
FIG. 51D is an elevational view of the nanowire network of FIG. 51A which has been processed to create a dynamic logic circuit.

The nanowire network 20 can also be processed to create a dynamic logic circuit 40, illustrated in FIG. 51D. For example, bonding pads or electrodes 41, 42, 43, 44, 45 and active devices 46 and 47 can be patterned onto a customized nanowire network using nanofabrication techniques. Electrodes 41, 42, 43, 44, 45 are electrically connected to other electronics, such as to a grounding potential, a voltage source, a detector, or another circuit. Devices 46 and 47 can function as gates or switches, and typically control the flow of current through a junction. For example, for nanowires that are semiconductive, a device 47 may control the electric field proximate to the nanowires intersecting at the location of device 47 based on the input from electrode 218. Regulation of the proximate electric field can control the flow of current through the semiconducting wires, similar to a field-effect transistor. Device 46 could be a similar type of device to device 47 or device 46 could be a variable resistor or other device for changing the electrical properties of the circuit. Where inputs at 45 and 43 control the flow of current across devices 47 and 46, respectively, and inputs at 41 and 42 represent a low and a high voltage (i.e. a potential difference is applied), dynamic circuit 40 can function as a digital logic gate such as an AND gate with output at 44. Logic circuit 40 can be used in various devices that require dynamic logic or where nano-scale circuitry would be particularly suitable.

Nano-scale logic circuits may be particularly suitable for integration with nano-sized devices because of their complementary sizes. Nano-scale logic circuits such as 30 and 40 may be particularly suitable for integration into nano-sensors networks, LEDs, transistors, nano-generators, and nano-device arrays. Examples of functional circuits, logic gates, and combinational logic that could be formed from the nanowire networks described herein are well-known to a person of ordinary skill in the art of electronics, and numerous examples appear in the book "The Art of Electronics, Second Edition," by Paul Horowitz and Winfield Hill, Cambridge University Press, 1989.

The embodiment illustrated in FIG. 51 is not intended to limit the potential application of the presented nanostructures or methods of nanostructure synthesis but is intended to be exemplary only of a genre of applications for which such nanostructures and methods of nanostructure synthesis may be particularly suitable.

The following embodiments and examples are provided to illustrate certain particular embodiments of the disclosure. Additional embodiments are not limited to the particular features described.

Embodiment 1

CdS Nanowires

In this embodiment, CdS nanostructures, nanowires, and nanowire networks are synthesized on a $BiI_3$ template. $BiI_3$ was chosen as the template because of its layered structure and polar Bi—I bonds aligned along its surface. During a typical CdS nanostructure synthesis process, thin $BiI_3$ flakes were formed naturally in a supersaturated solution after an ultrasonic treatment and subsequently transferred to a substrate. The substrate with deposited $BiI_3$ flakes was then introduced into $Cd^{2+}/S/C_{32}H_{66}$ mixtures, followed by a washing process after reaction. The non-polar organic solvent $C_{32}H_{66}$ was used to provide a temperature controlling reaction condition due to its high boiling point of 467° C.

Example 1

In a first example of CdS nanostructure synthesis, cadmium acetate dihydrate ($Cd(Ac)_2.2H_2O$, 99.999%), sulfur powder (S, 99.5%), dotriacontane ($C_{32}H_{66}$, 97%), and bismuth (III) iodide ($BiI_3$, 99.999%) were purchased from Alfa Aesar. Isopropanol and acetone were used as analytical reagents.

Figure 4:
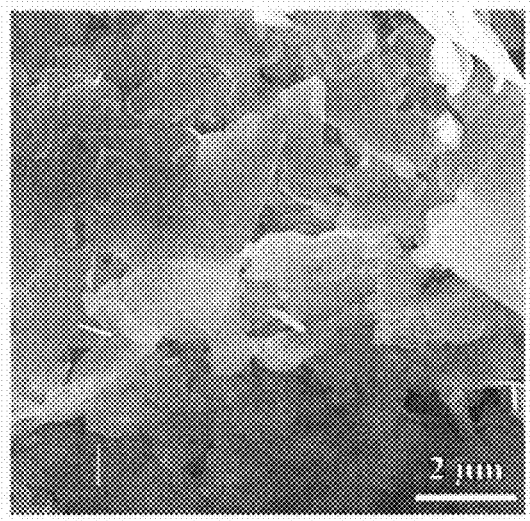
FIG. 4 is an SEM image of $BiI_3$ flakes deposited on a silicon substrate.

Various types of substrates including Si, $SiO_2$/Si, and glass substrates were ultrasonically cleaned in isopropanol and in acetone at room temperature, and then dried with flowing nitrogen. A mixture of $BiI_3$ and ethanol was created by adding $BiI_3$ to ethanol to form a saturated solution at room temperature. The mixture was treated ultrasonically for 20 minutes. $BiI_3$ flakes in the range of 0.2 mm to 0.5 mm in size were formed in the $BiI_3$/ethanol supersaturated solution after 3 days. Concentrations of $BiI_3$ relative to ethanol were estimated at about 2 g:5 g. A pipette was used to transfer several drops of solution onto the surface of the substrate and the substrate was set aside to let the solution dry. The rest of the solution was stored for future use as the $BiI_3$ flakes can be preserved in the supersaturated solution for several months. FIG. 4 shows an SEM image of the $BiI_3$ flakes deposited on a silicon substrate.

The solvent solution was then prepared by loading 0.2 g of $Cd(Ac)_2.2H_2O$ and 5 g of $C_{32}H_{66}$ into a 25 mL reaction flask. The solution was heated at 160° C. for 2 hours. A substrate covered with $BiI_3$ flakes was immersed into the solution at a reaction temperature between about 160° C. and about 220° C. for 5 minutes. 0.15 g of sulfur powder was then added to the solution. After a reaction time of about 3 hours to about 48 hours, the substrate was retrieved from the solution. Residual $C_{32}H_{66}$ and unreacted chemicals on the surface of the substrate were washed off using isopropanol at 60° C. and acetone at room temperature. The samples were then dried at 200° C. for 2 hours. All synthesis steps were carried out under atmospheric pressure.

Without limitation to any particular theory, it currently is believed that the nanostructure synthesis described in Example 1 occurs via a chelation-deposition-epitaxy (CDE) growth mechanism. Such a mechanism includes three stages: chelation, deposition, and epitaxial elongation growth. For example, for CdS nanowires synthesized in a $C_{32}H_{66}$ solution on a $BiI_3$ template, the growth process may be described in the following manner. Due to the polar Bi—I on the surface of $BiI_3$ flakes and the bonding match between $BiI_3$ and $CdI_2$, $Cd^{2+}$ is typically chelated on the surface of $BiI_3$ flakes. The chelation process forms a Bi—I—Cd layer structure on the interface between the surface of $BiI_3$ and the neutral $C_{32}H_{66}$ during the initial period of the growth process. Sulfur is coordinated on the layer of $Cd^{2+}$ due to electrostatic force and results in a stable Bi—I—Cd—S layer structure after the $CH_3COO$—Cd bond decomposition.

The next stage is characterized by a deposition process. CdS crystals grow with the repeated deposition of $Cd^{2+}$ and sulfur. At a reaction temperature of about 185° C., CdS nanowires typically produce T-type intersections and networks on the surface of a $BiI_3$ flake. The nanowire crossings may be attributable to the coordination between multipod (bipod, tripod and tetrapod) nanostructure growth and the electrostatic force of Bi—I bonds. These nanostructures tend to elongate and interconnect to form square grid networks assisted by the two-dimensional template of the $BiI_3$ flakes. Then, the nanowires grow out beyond the edges of the flakes and continue growing by epitaxial elongation as the reaction time increases. The continued growth of ordered CdS sphalerite nuclei formed on the surface of the $BiI_3$ flakes along the four equivalent fast growing facets in two intercross orientations results in the formation of nanowire networks. A square network pattern may be attributable to coordination between CdS crystal isotropic growth and the electrostatic force of the Bi—I layer.

EDX analyses of the samples indicate that the $BiI_3$ generally decomposes gradually with increasing reaction time. The elemental compositions of bismuth and iodine in the nanostructures tend to decrease with increasing reaction time and the atomic percentages of cadmium and sulfur increase correspondingly. On the surface of a $BiI_3$ flake, the decomposition rate for Bi—I bonds that were covered by CdS nanowires was typically slower than that of Bi—I bonds which were not covered by the CdS nanowires. This slow decomposition may result from the formation of coordination bonds of Cd—I, suggesting that the area covered with CdS nanowires is stable. Samples Using the method of nanostructure synthesis described in Example 1, Samples A through H were prepared and analyzed. Sample A was reacted at a temperature of 160° C. for a reaction time of 12 hours. Sample B was reacted at a temperature of 185° C. for a reaction time of 12 hours. Sample C was reacted at a temperature of 220° C. for a reaction time of 12 hours. Sample D was reacted at a temperature of 185° C. for a reaction time of 3 hours. Sample E was reacted at a temperature of 185° C. for a reaction time of 6 hours. Sample F was reacted at a temperature of 185° C. for a reaction time of 18 hours. Sample G was reacted at a temperature of 185° C. for a reaction time of 24 hours. Sample H was reacted at a temperature of 185° C. for a reaction time of 48 hours.

The morphology and the internal nanostructure of Samples A through H were analyzed using a FEI Siron field emission SEM equipped with an energy-dispersive X-ray (EDX) spectrometer, and a FEI Tecnai F-20 TEM equipped with a scanning transmission microscopy (STEM) capability and a EDX function. Infrared spectra (IR) of the samples at 400-4400 $cm^{-1}$ were recorded with a Perkin Elmer spectrum RX1 via the KBr pellets technique.

Sample A

Figure 5:
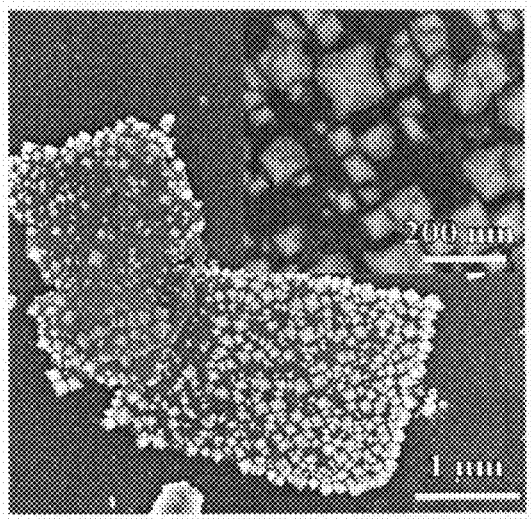
FIG. 5 is an SEM image of a Sample A which was synthesized at a temperature of 160° C. for a reaction time of 12 hours.

Sample A was prepared using the method described in Example 1, with a reaction temperature of 160° C. for a reaction time of 12 hours. CdS nanostructures of Sample A resembled pyramid-like particles. Such particles were formed on the surface of the $BiI_3$ flakes as shown in the SEM image of FIG. 5. The inset image in FIG. 5 is a high magnification image of a small area of Sample A. The borders of the pyramid-shaped particles tended to form in parallel in two intercross orientations on the same flake.

The bottom length of the quadrilateral plane ranges from about 20 nm to about 150 nm and most of the pyramid particles bottom lines are parallel to one another, as are the edges of their steeply sloping sides. The particle distributions along the edges of the flakes were typically denser than those in the center of the flakes.

Sample B

Figure 6:
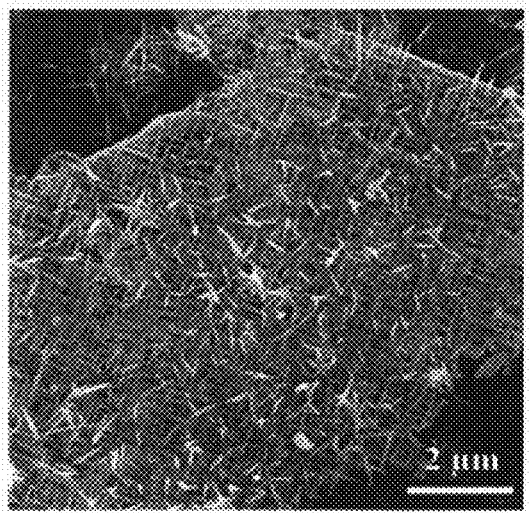
FIG. 6 is an SEM image of a Sample B which was synthesized at a temperature of 185° C. for a reaction time of 12 hours.

Sample B was prepared using the method described in Example 1, with a reaction temperature of 185° C. for a reaction time of 12 hours. The CdS nanostructures of Sample B resembled mono-layer square two-dimensional nanowire networks. Such networks were formed where the nanowires aligned into two intercrossed orientations. The crossed nanowires were grown together in an interconnect configuration resembling a network. FIG. 6 is an SEM image of Sample B demonstrating the typical structural configuration the nanowire networks. The average diameter of the nanowires was about 40±15 nm. The size of the network was based on the size of the $BiI_3$ flake.

Figure 7:
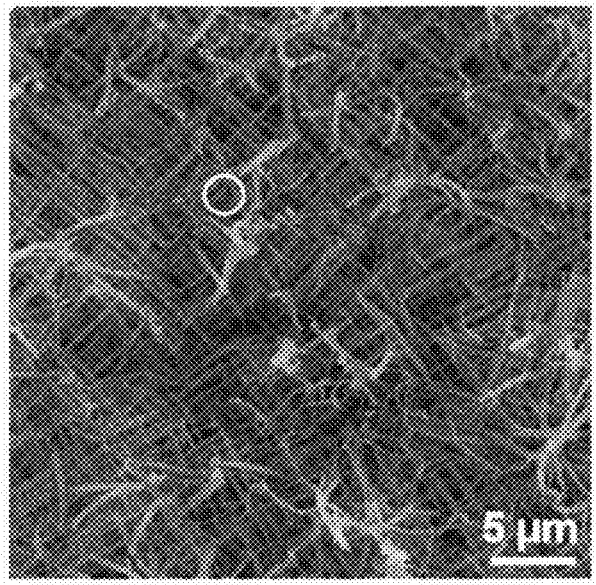
FIG. 7 is an SEM image of Sample B indicating a portion to be examined using energy dispersive X-ray spectroscopy.
Figure 8:
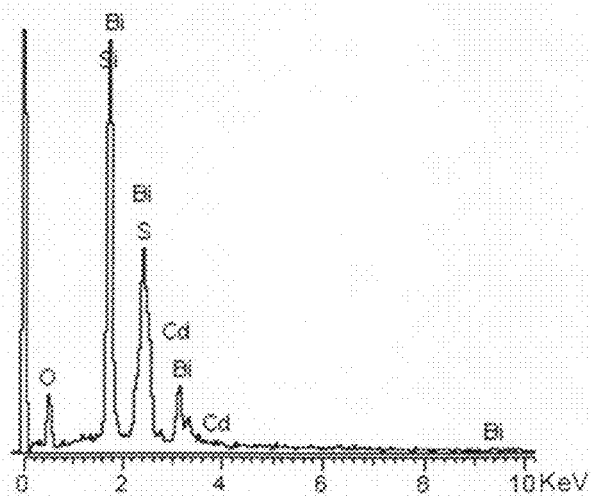
FIG. 8 is an energy dispersive X-ray spectrum for the portion of Sample B indicated in FIG. 7.

Energy dispersive X-ray (EDX) spectroscopy was used to characterize the chemical composition of Sample B. A portion of Sample B was chosen from the SEM image of Sample B shown in FIG. 7. The EDX spectrum from this portion of the sample is shown in FIG. 8 and the results are summarized in Table 1 for five different elemental compositions. The results in Table 1 suggest that the atomic percentages of elemental compositions of bismuth and iodine decrease with increasing reaction time and that the atomic percentages of cadmium and sulfur increase correspondingly.

TABLE 1

| Atomic percentages for Sample B | | | | |
|---|---|---|---|---|
| Element | | | | |
| Bi | Cd | S | Si | O |
| Atomic % 7.49 | 5.06 | 4.47 | 31.31 | 51.68 |

Sample C

Figure 9:
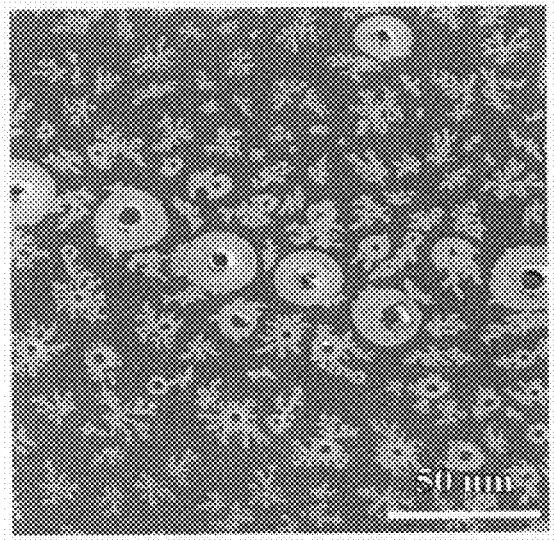
FIG. 9 is an SEM image of a Sample C which was synthesized at a temperature of 220° C. for a reaction time of 6 hours.

Sample C was prepared using the method described in Example 1, with a reaction temperature of 220° C. for a reaction time of 6 hours. The CdS nanostructures of Sample C suggest that, at this reaction temperature, $BiI_3$ flakes tend to decompose completely in a few hours and form bismuth drops dispersed on the substrate. An SEM image of Sample C is shown in FIG. 9.

Sample D

Figure 10:
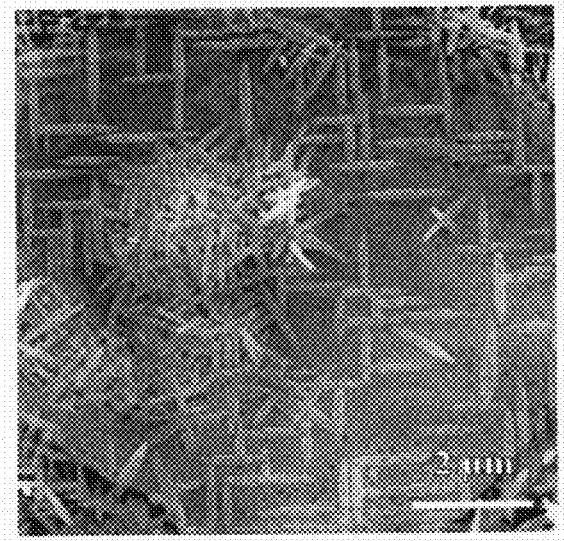
FIG. 10 is an SEM image of a Sample D which was synthesized at a temperature of 185° C. for a reaction time of 3 hours.

Sample D was prepared using the method described in Example 1, with a reaction temperature of 185° C. for a reaction time of 3 hours. FIG. 10 is an SEM image of Sample D. In FIG. 10, short CdS nanowires with a relatively low density distribution are shown generally lined up perpendicularly to one another. In Sample D, some nanowires formed T-shaped nanostructures and a few T-shape nanostructures are connected to form small-sized nanowire networks. The nanowires tend to have sharp tips that are aligned mainly in two intercrossed directions. The diameter of the nanowires in Sample D ranged from about 150 nm to about 200 nm.

Figure 11:
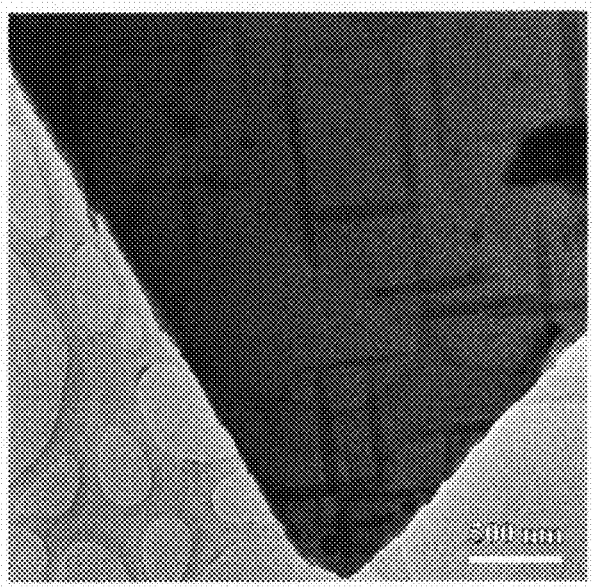
FIG. 11 is a TEM image of Sample D.

FIG. 11 is a TEM image of Sample D suggesting that nanowires formed substantially on the surface of $BiI_3$ flakes and that most of the nanowires in the sample are associated with the flakes.

Figure 12:
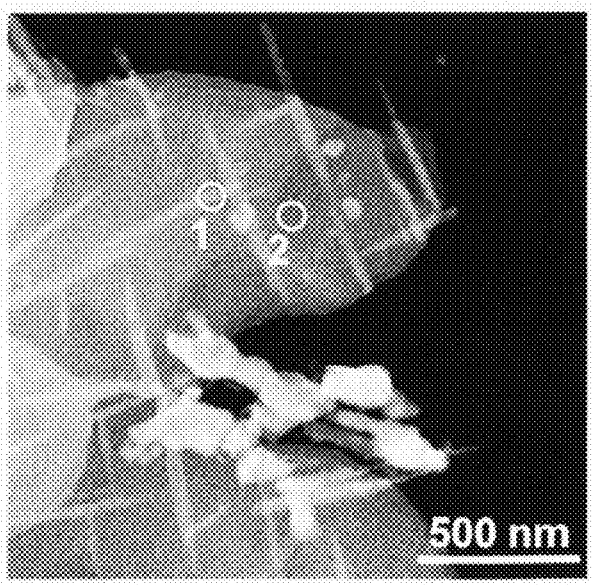
FIG. 12 is an STEM image of Sample D indicating two portions to be examined using energy dispersive X-ray spectroscopy.
Figure 13:
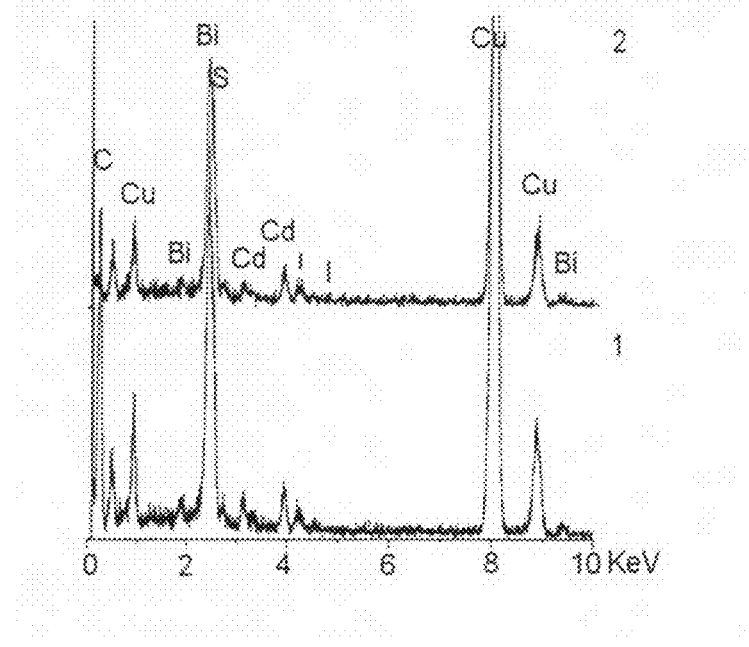
FIG. 13 is an energy dispersive X-ray spectrum for a portion 1 and a portion 2 of Sample D indicated in FIG. 12.

Energy dispersive X-ray (EDX) spectroscopy was used to characterize the chemical composition of Sample D. Two portions of Sample D, labeled "1" and "2," were chosen from the scanning transmission electron microscope (STEM) image of Sample D shown in FIG. 12. EDX spectra from each of these portions of Sample D are shown in FIG. 13 and the results are summarized in Table 2 for four different elemental compositions. Portion 1 appears in FIG. 12 to be a segment of a CdS nanowire. Correspondingly, in Table 2, portion 1 exhibits a higher atomic percentage of cadmium and of sulfur than portion 2. Portion 2 appears to be of a section of a $BiI_3$ flake. Correspondingly, in Table 2, portion 2 exhibits a higher atomic percentage of bismuth than portion 1. However, the significant percentages of cadmium and of sulfur in portion 2 indicate that the flake is in a transition. This transition can be characterized by saturation with cadmium and sulfur such that flakes contain a mixture of CdS and $BiI_3$.

TABLE 2

| Atomic percentages for Sample D | | | | |
|---|---|---|---|---|
| | Element | | | |
| | Bi | I | Cd | S |
| 1, Atomic % | 79.125 | 7.921 | 5.477 | 7.475 |
| 2, Atomic % | 88.424 | 6.492 | 2.307 | 2.775 |

Sample E

Figure 14:
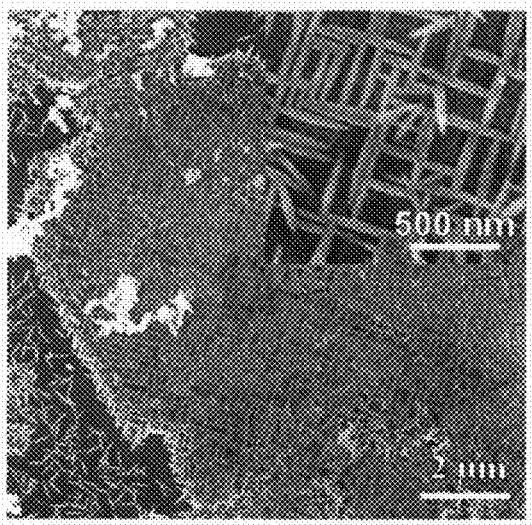
FIG. 14 is an SEM image of a Sample E which was synthesized at a temperature of 185° C. for a reaction time of 6 hours. Inset in FIG. 14 is a high magnification SEM image of Sample E.

Sample E was prepared using the method described in Example 1, with a reaction temperature of 185° C. for a reaction time of 6 hours. FIG. 14 is an SEM image of Sample E. In general, Sample E formed large area mono-layer nanowire networks. FIG. 14 shows numerous nanowire connections formed on the flakes. The average diameter of the nanowires was approximately 40±10 nm. The density of the nanowires along the edge of the flakes was typically slightly larger than those networks forming in the central area of the flake.

Figure 15:
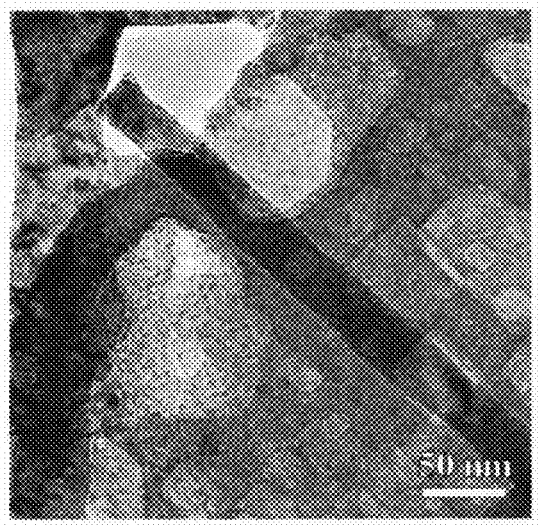
FIG. 15 is a TEM image of Sample E.

FIG. 15 shows a TEM image of Sample E, where a CdS nanowire with a diameter of about 40 nm is lying on the surface of a flake. The thickness of the $BiI_3$ flake is shown to be thinner in some areas when compared to the flakes shown in FIG. 11 suggesting that the $BiI_3$ flakes are further decomposed as the reaction time is increased.

Sample F

Figure 16:
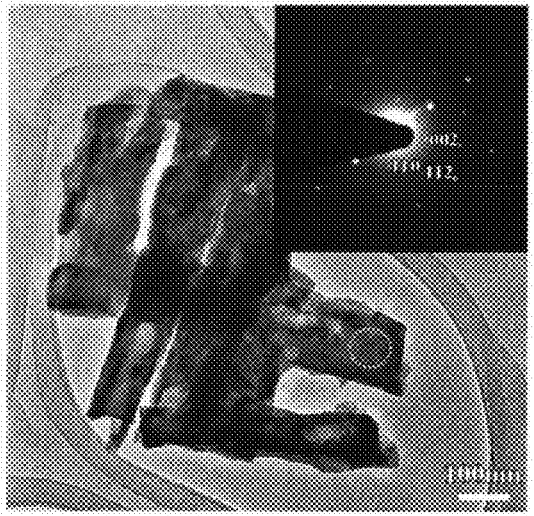
FIG. 16 is a TEM image of a Sample F which was synthesized at a temperature of 185° C. for a reaction time of 18 hours. Inset in FIG. 16 is a selected area diffraction image of Sample F.

Sample F was prepared using the method described in Example 1, with a reaction temperature of 185° C. for a reaction time of 18 hours. FIG. 16 is TEM image of a network fragment formed on Sample F. It is noticeable that only fragments of the $BiI_3$ flake are attached to the nanowire networks in FIG. 16. A selected area diffraction (SAD) pattern suggests that the CdS nanowires of Sample F grew along the [001] direction and were covered with residual amorphous compounds.

Sample G

Figure 17:
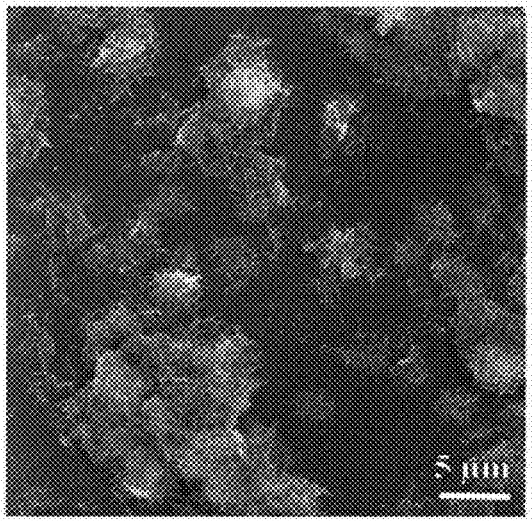
FIG. 17 is an SEM image of a Sample G which was synthesized at a temperature of 185° C. for a reaction time of 24 hours.
Figure 18:
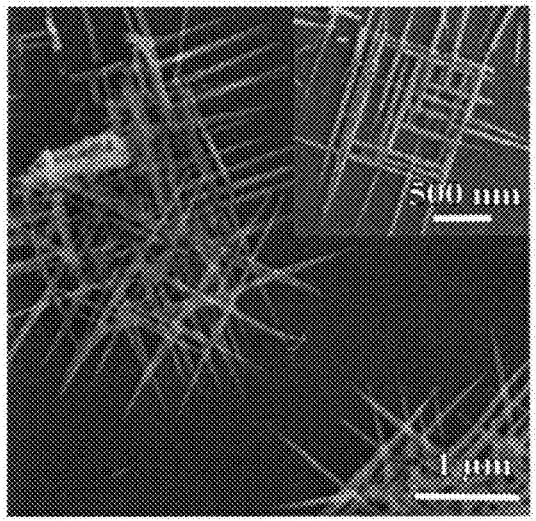
FIG. 18 is an SEM image inset with a high magnification SEM image of multi-layer networks in Sample G.

Sample G was prepared using the method described in Example 1, with a reaction temperature of 185° C. for a reaction time of 24 hours. FIG. 17 is an SEM image of Sample G. For Sample G, mono-layer and multi-layer nanowire networks of high density were formed on the substrate where the density of the $BiI_3$ flakes was significantly reduced. FIG. 18 is a high magnification SEM image of several small pieces of the nanowire networks in FIG. 17. FIG. 18 reveals that each network layer of a multi-layer structure corresponds to a different aligned orientation. The insert image in FIG. 18 illustrates a typical mono-layer nanowire network where the diameter of the nanowires is uniform and the tips of the nanowires are thinner than the body of the wires.

Figure 19:
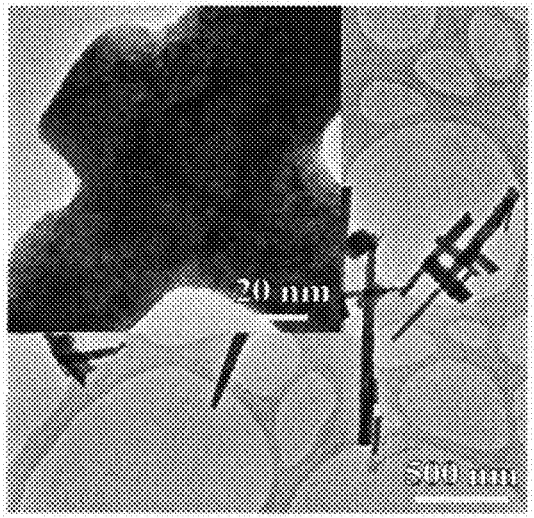
FIG. 19 is a TEM image of Sample G with an HRTEM image of Sample G inset.

FIG. 19 is a TEM image of Sample G. FIG. 19 demonstrates the interconnected structure of a nanowire network fragment. The insert in FIG. 19 is a HRTEM image of a typical interconnected point of the nanowire network.

Figure 20:
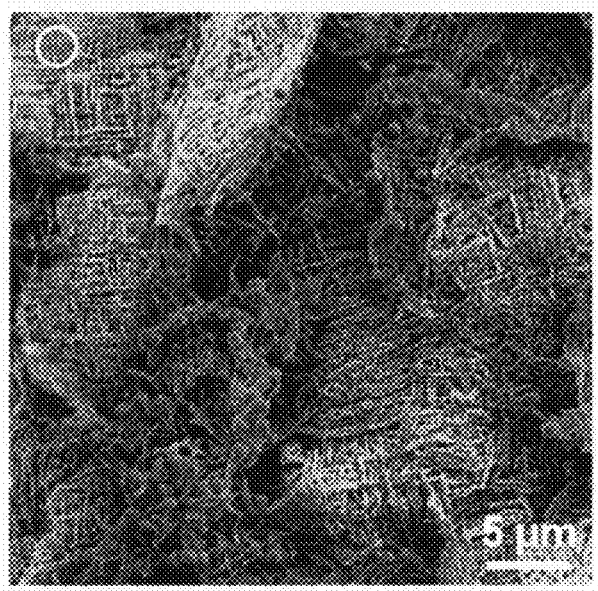
FIG. 20 is an SEM image of Sample G indicating a portion to be examined using energy dispersive X-ray spectroscopy.
Figure 21:
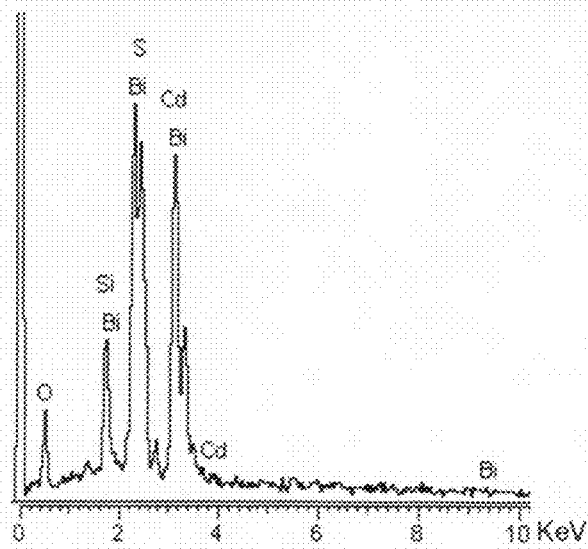
FIG. 21 is an energy dispersive X-ray spectrum for the portion of Sample G indicated in FIG. 20.

Energy dispersive X-ray (EDX) spectroscopy was used to characterize the chemical composition of Sample H. A portion of Sample H was chosen from the SEM image of Sample H shown in FIG. 20. The EDX spectrum from this portion of the sample is shown in FIG. 21 and the results are summarized in Table 3 for five different elemental compositions. The results in Table 3 suggest that the atomic percentages of elemental compositions of bismuth and iodine decrease with increasing reaction time and that the atomic percentages of cadmium and sulfur increase correspondingly.

TABLE 3

Atomic percentages for Sample G

| | Element | | | | |
|---|---|---|---|---|---|
| | Bi | Cd | S | Si | O |
| Atomic % | 7.11 | 16.34 | 16.62 | 7.17 | 52.76 |

Sample H

Figure 22:
FIG. 22 is an SEM image of a Sample H which was synthesized at a temperature of 185° C. for a reaction time of 48 hours.
Figure 23:
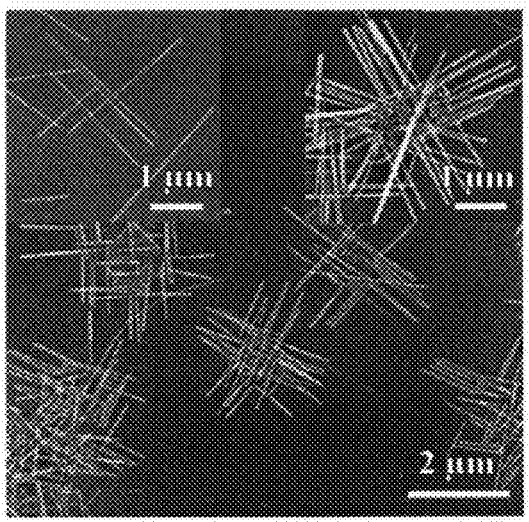
FIG. 23 is a high magnification image of Sample H with insets indicating typical mono- and multi-layer networks.

Sample H was prepared using the method described in Example 1, with a reaction temperature of 185° C. for a reaction time of 48 hours. FIG. 22 is an SEM image of Sample H. Multi-layer nanowire networks with high yield and fine uniformity were formed as shown in FIG. 22. High magnification SEM images in FIG. 23 further demonstrate the superposition and the alignment orientation of the multi-layer nanowire networks. The inset on the top right corner of the FIG. 23 shows that the two layers of nanowire networks are aligned in two different orientations while the inset on the top left corner of FIG. 23 reveals that the diameter of the nanowires is uniform typically around 40±10 nm. Both FIGS. 22 and 23 demonstrate nanowires in mono-layer and multi-layer nanowire networks that are straight and uniform. These networks are no longer substantially associated with the $BiI_3$ flakes.

Figure 24:
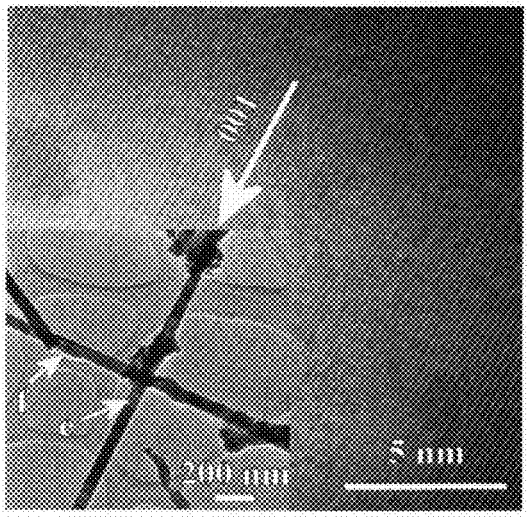
FIG. 24 is a high resolution TEM image of Sample H inset with a low magnification TEM image of Sample H.
Figure 25:
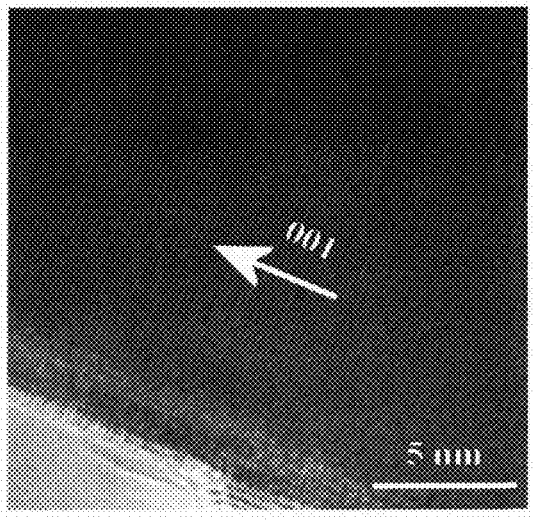
FIG. 25 is a high resolution TEM image of Sample H.

FIGS. 24 and 25 are high resolution TEM images of Sample H. The inset in FIG. 24 indicates with arrows marked "e" and "f" on a TEM image of Sample H the portions of Sample H used for the HRTEM images of FIG. 24 and FIG. 25, respectively. The HRTEM images of FIGS. 24 and 25 indicate that the growth of the nanowires is along the [001] orientation.

Figure 26:
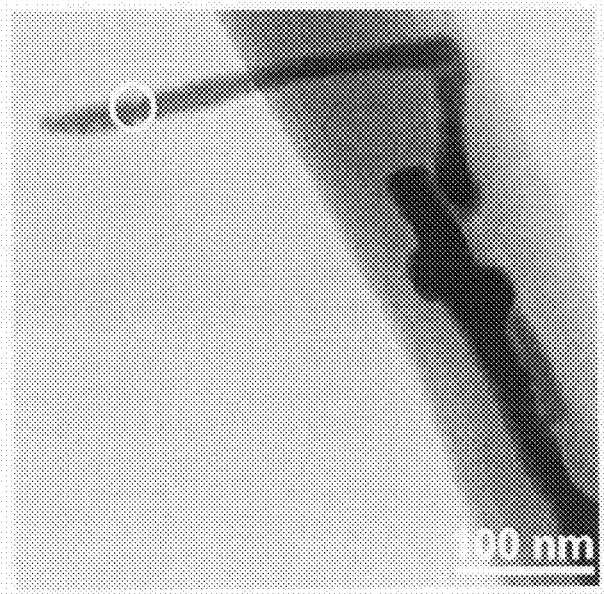
FIG. 26 is an STEM image of Sample H indicating a portion to be examined using energy dispersive X-ray spectroscopy.
Figure 27:
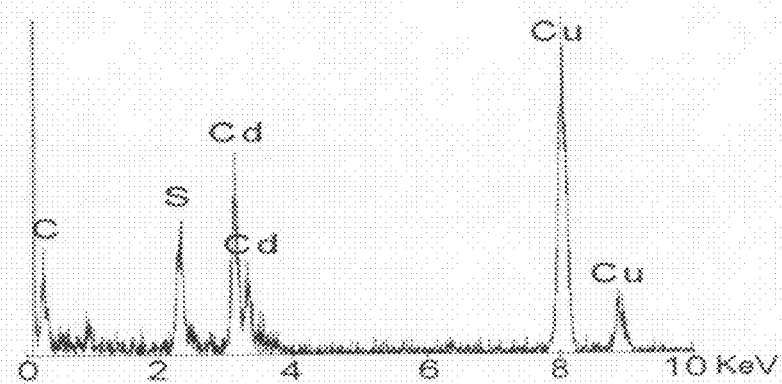
FIG. 27 is an energy dispersive X-ray spectrum for the portion of Sample G indicated in FIG. 26.

Energy dispersive X-ray (EDX) spectroscopy was used to characterize the chemical composition of Sample H. A portion of Sample H was chosen from the SEM image of Sample H shown in FIG. 26. The EDX spectrum from this portion of the sample is shown in FIG. 27 and the results are summarized in Table 4 for four different elemental compositions. The results in Table 4 suggest that the atomic percentages of elemental compositions of bismuth and iodine decrease with increasing reaction time and that the atomic percentages of cadmium and sulfur increase correspondingly.

TABLE 4

Atomic percentages for Sample H

| | Element | | | |
|---|---|---|---|---|
| | Cd | S | Cu | C |
| Atomic % | 25.489 | 23.684 | 31.215 | 19.609 |

Example 2

A substrate was prepared in the manner described in Example 1, where the reaction temperature was maintained at about 185° C. Samples with different reaction times were then annealed because the reaction time tends to affect the quality of the synthesized nanostructures. Nanostructures tend to be less stable during a subsequent annealing step when reaction times are shorter.

Figure 28:
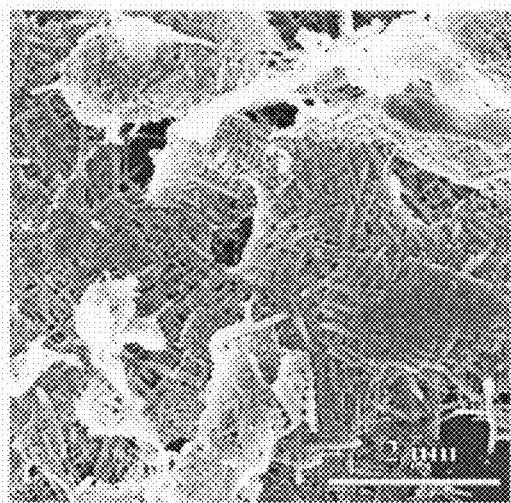
FIG. 28 is an SEM image of nanowire networks synthesized at 185° C. with a reaction time of 12 hours and then annealed at 250° C. for 2 hours.
Figure 29:
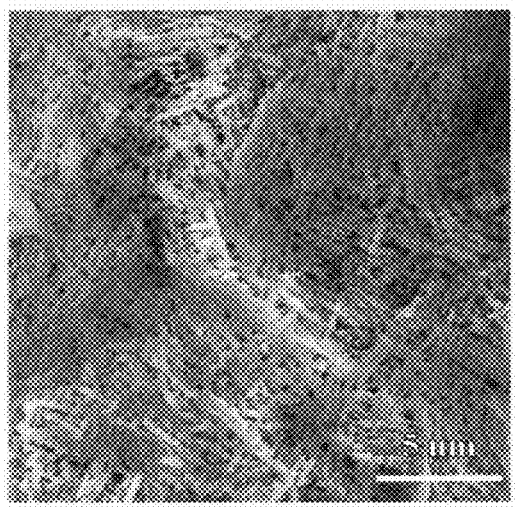
FIG. 29 is an SEM image of nanowire networks synthesized at 185° C. with a reaction time of 12 hours and then annealed at 300° C. for 2 hours.

For example, nanostructures synthesized at 185° C. with a reaction time longer than 24 hours tend to be stable under the annealing temperature of 200° C. to 300° C. for 2 hours. Under this annealing condition no significant variation for the morphologies of the nanowire networks was observed. However, samples made at 185° C. with a reaction time of 12 hours were not stable under the annealing temperature of 250° C. and 300° C. as demonstrated in FIGS. 28 and 29, respectively. After a sample was annealed at 250° C. for 2 hours, the nanowire networks started to agglomerate, as shown in FIG. 28. The annealed nanowire network structures were almost sintered to one piece of film after annealing at a temperature of 300° C. for 2 hours, as shown in FIG. 29.

Example 3

Figure 30:
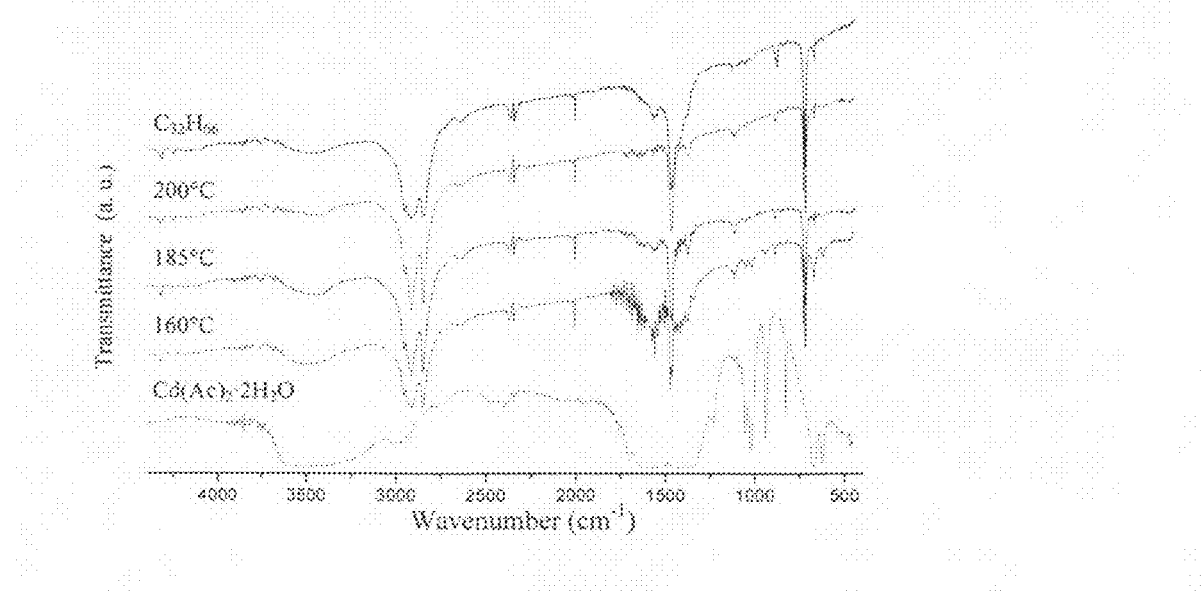
FIG. 30 is a plot of infra-red spectra of $C_{32}H_{66}$, $Cd(Ac)_2 \cdot 2H_2O$ and three sample CdS nanowire networks synthesized with a reaction time of 3 hours at reaction temperatures of 160° C., 185° C., and 200° C.

FIG. 30 shows IR spectra of $C_{32}H_{66}$, $Cd(Ac)_2.2H_2O$, and samples prepared according to Example 1 with a reaction time of 3 h at reaction temperatures of 160° C., 185° C. and 200° C. A comparison of the IR spectra plotted in FIG. 30 suggests that the spectra of samples are typically similar to the spectrum of $C_{32}H_{66}$ and that $H_2O$ and small organic molecules can be evaporated after pretreatment. In this manner, the polar organic groups are shown to be inconspicuous in the reaction system. The weak absorption that appears in FIG. 30 at 3350 cm$^{-1}$ was associate with OH ions, which were introduced by adding $Cd(Ac)_2.2H_2O$.

Example 4

Figure 31:
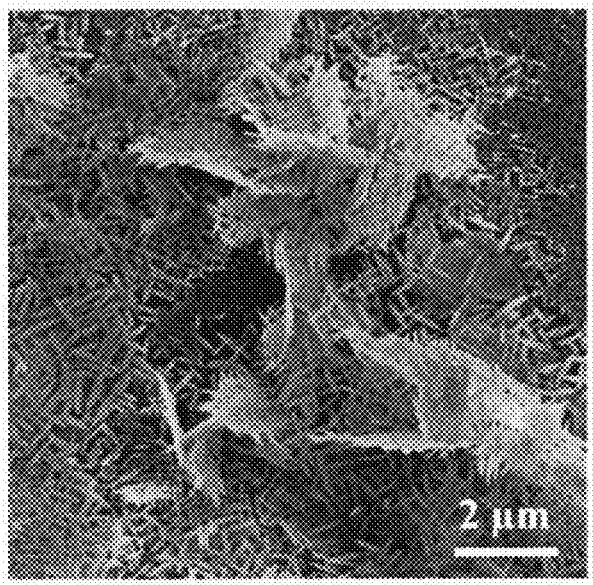
FIG. 31 is an SEM image of two-dimensional CdS nanowire networks grown from templates positioned according to different orientations.

In this fourth example, CdS nanowires were synthesized according to Example 1, with a reaction temperature of 185° C. and a reaction time of 18 hours. During the deposition of the layered structure compound template, multiple $BiI_3$ flakes were oriented substantially vertical to the substrate surface. As shown in the SEM image in FIG. 31, CdS networks are oriented according to the orientation of the template. FIG. 31 shows some of the CdS nanowire networks orientated substantially vertically with respect to the substrate surface.

Embodiment 2

CdSe Nanowires

In this embodiment, CdSe nanostructures, nanowires, and nanowire networks are synthesized on a $BiI_3$ template. In an example synthesis, thin $BiI_3$ flakes were formed naturally in a supersaturated solution after an ultrasonic treatment and subsequently transferred to a substrate. A silicon substrate was chosen for this example, though substrates including $SiO_2$, glass, or any other material can be used.

A $Cd^{2+}/Se/C_{32}H_{66}$ admixture was prepared by heating a mixture of 0.2 g $Cd(Ac)_2 \cdot 2H_2O$ and 5.0 g of $C_{32}H_{66}$ for two hours and then adding 0.15 g of selenium powder to the heated mixture. The substrate was then contacted with the $Cd^{2+}/Se/C_{32}H_{66}$ admixture. After removing the substrate from the admixture, residual $C_{32}H_{66}$ and unreacted chemicals on the surface of the substrate were washed off using isopropanol at 60° C. and acetone at room temperature. The substrates were then dried at 200° C. for 2 hours under argon flow.

Figure 32:
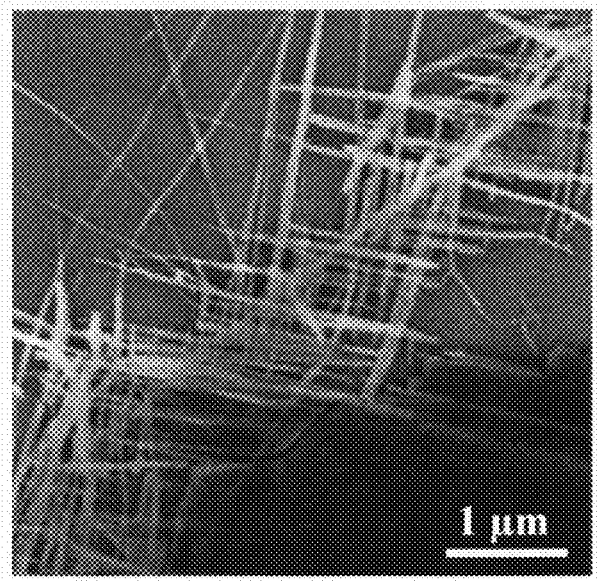
FIG. 32 is an SEM image of CdSe nanowire networks synthesized at a temperature of 185° C. for a reaction time of 48 hours.

FIG. 32 is an SEM image of CdSe nanowire networks that were synthesized at 185° C. for 36 hours.

Embodiment 3

$CdS/CdS_xO_{1-x}/CdO$ Nanowires

In this embodiment, CdS, $CdS/CdS_xO_{1-x}/CdO$, and CdO nanostructures, nanowires, and nanowire networks are synthesized on a $BiI_3$ template. In this embodiment, $BiI_3$ concentration was typically not sufficient to form large $BiI_3$ flakes. During a typical $CdS/CdS_xO_{1-x}/CdO$ nanostructure synthesis process, a $BiI_3$/ethanol solution was coated onto a substrate and allowed to dried naturally. The substrate was then introduced into $Cd(CH_3COO)_2 \cdot 2H_2O/S/C_{32}H_{66}$ mixtures. The concentration of sulfur in the mixtures can be varied to vary the constituent stoichiometry of $CdS/CdS_xO_{1-x}/CdO$ nanostructures. Reactions lasted for 3-48 hours and were maintained at reaction temperatures between about 160° C. and 200° C.

Example 5

In an example of $CdS/CdS_xO_{1-x}/CdO$ nanostructure synthesis, a $BiI_3$/ethanol solution was formed by dissolving 1 g $BiI_3$ in 5 ml ethanol. A silicon substrate was then coated with the $BiI_3$/ethanol solution and allowed to dry naturally. The coated substrate was again coated with the $BiI_3$/ethanol solution and allowed to dry and the coating and drying steps repeated until the substrate had been coated a total of three times. A solvent solution was created by adding 0.2 g of $Cd(CH_3COO)_2 \cdot 2H_2O$ to 5 g of $C_{32}H_{66}$. The solvent solution was then heated at about 160° C. for 2 hours. The coated substrate was introduced into the solvent solution. 0.15 g of sulfur powder was then added to the solvent solution and the sulfur/solvent solution was maintained at a reaction temperature of about 170° C. for a reaction time of 5 hours. The substrate was then washed in isopropanol at about 160° C. for 30 minutes and dried at about 200° C. for 0.5 hours.

Figure 33:
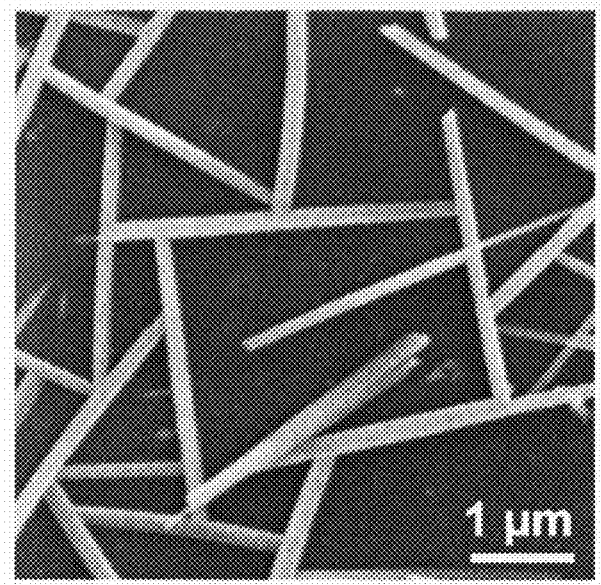
FIG. 33 is an SEM image of the nanowires grown at 170° C. for 5 hours on a substrate coated three times with a $BiI_3$/ethanol solution.

Nanostructures in this example included substantially straight nanowires, composed substantially of CdS, having diameters of between about 150 and about 200 nm. FIG. 33 is an SEM imaged of nanowires synthesized in this example. As shown in FIG. 33, nanowires grew substantially parallel to the substrate surface, and typically intersected to form planar networks.

Without limitation to any particular theory, it currently is believed that the nanostructure synthesis described in this example exhibits planar growth as a result of properties of the two-dimensional $BiI_3$ template. The role the $BiI_3$ template in shaping the morphology of synthesized nanostructures may be similar to the mechanism of a capping ligand or an ethylenediamine template. As a typical layered structure compound, $BiI_3$ typically forms with three layer packages I—Bi—I) which are connected through weak van der Waals forces. Polar Bi—I bonds align along a two-dimensional surface of the layered compound. The long and straight appearance of nanowires synthesized in this example may be attributed to lineal alignment of $Cd^{2+}$ and S on the $BiI_3$ template due to electrostatic force between Bi—I bonds and $Cd^{2+}$, which is accompanied by sulfur deposition to minimize surface energy. Nanowires then grow epitaxially along the two-dimensional $BiI_3$ template.

Thin $BiI_3$ flakes typically exhibit a stable crystal surface. However, temperature may determine the size of thermally stable regions on the surface of a $BiI_3$ flake, or in general on the surface of a $BiI_3$ template. For example, regions of thermally stable alignment of $Cd^{2+}$ with polar Bi—I bonds can be larger for a reaction temperature of 170° C. than for a reaction temperature of 185° C. As a result, larger nanowires may form at a reaction temperature of 170° C., compared to a higher reaction temperature of, for example, 185° C.

Example 6

In an example of $CdS/CdS_xO_{1-x}/CdO$ nanostructure synthesis, a $BiI_3$/ethanol solution was formed by dissolving 1 g $BiI_3$ in 5 ml ethanol. Silicon substrates were then coated with the $BiI_3$/ethanol solution and allowed to dry naturally to create Samples I-M. In this example, the number of repetitions of the coating and drying steps was varied in Samples I-M to vary the $BiI_3$ concentration on the substrate surface across Samples I-M. Sample I was coated once with the $BiI_3$/ethanol solution and then allowed to dry. Sample J was coated once with the $BiI_3$/ethanol solution, allowed to dry, and then the coating and drying steps were repeated until the substrate had been coated a total of two times. Sample K was coated once with the $BiI_3$/ethanol solution, allowed to dry, and then the coating and drying steps were repeated until the substrate had been coated a total of three times. Sample L was coated once with the $BiI_3$/ethanol solution, allowed to dry, and then the coating and drying steps were repeated until the substrate had been coated a total of four times. Sample M was coated once with the $BiI_3$/ethanol solution, allowed to dry, and then the coating and drying steps were repeated until the substrate had been coated a total of five times.

For each of Samples I-M: a solvent solution was created by adding 0.2 g of $Cd(CH_3COO)_2 \cdot 2H_2O$ to 5 g of $C_{32}H_{66}$. The solvent solution was then heated at about 160° C. for 2 hours. The sample was introduced into a solvent solution. 0.15 g of sulfur powder was then added to the solvent solution and the sulfur/solvent solution was maintained at a reaction temperature of about 185° C. for a reaction time of about 5 hours. The substrate was then washed in isopropanol at about 160° C. for about 30 minutes and dried at about 200° C. for about 0.5 hours.

Figure 34:
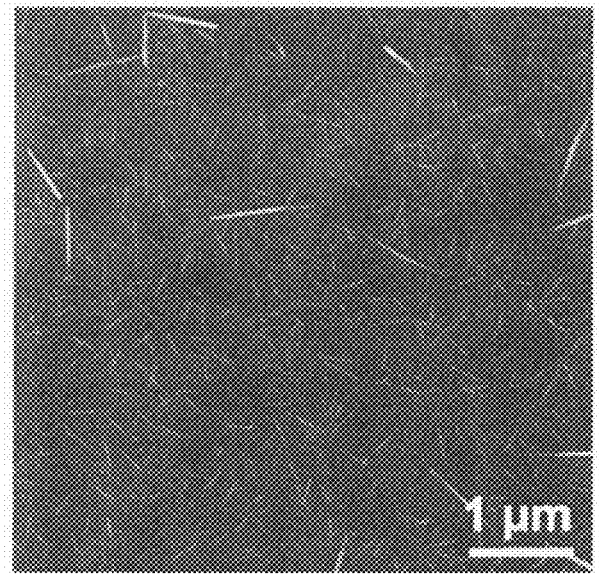
FIG. 34 is an SEM image of a Sample I which was synthesized at 185° C. for 5 hours on a substrate coated once with a $BiI_3$/ethanol solution.

FIG. 34 is an SEM image of Sample I. Nanowires in Sample I typically had diameters of between about 10 nm and about 20 nm and lengths of between about 0.4 μm and about 0.6 μm. A few nanowires with diameters of between about 20 and about 40 nm were formed in Sample I.

Figure 35:
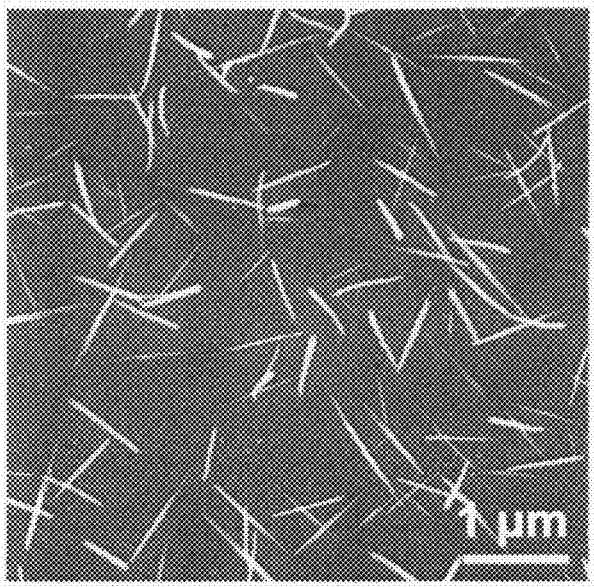
FIG. 35 is an SEM image of a Sample J which was synthesized at 185° C. for 5 hours on a substrate coated two times with a $BiI_3$/ethanol solution.

FIG. 35 is an SEM image of Sample J. Nanowires in Sample J typically had diameters of between about 30 nm and about 50 nm and lengths of between about 0.8 μm and about 1.5 μm.

Figure 36:
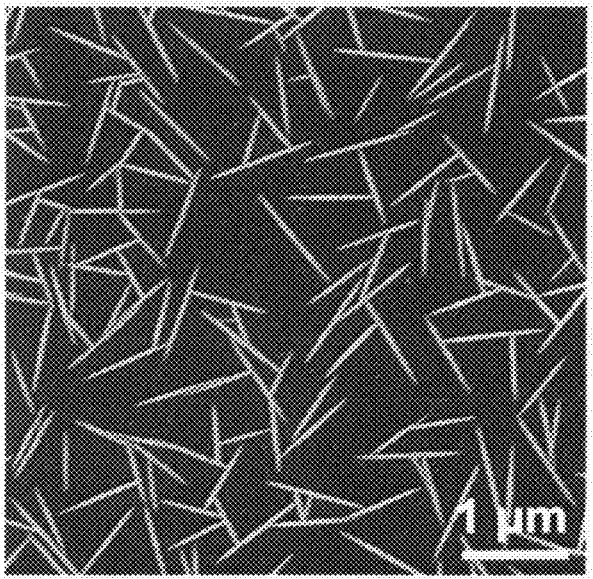
FIG. 36 is an SEM image of a Sample K which was synthesized at 185° C. for 5 hours on a substrate coated three times with a $BiI_3$/ethanol solution.

FIG. 36 is an SEM image of Sample K. Nanowires in Sample K typically had diameters of between about 40 nm and about 60 nm and lengths of between about 1 μm and 1.2 μm. Some nanowires in Sample K appeared to be connected such as to form branched structures or planar networks. Notably, nanowires in Samples I-K are smaller in size than nanowires from Example 5 which can be at least partially attributed to the higher reaction temperature in this example compared to that of Example 5. In general, Samples I-K included nanowires characterized by end tips that were thinner than the nanowire body.

Figure 37:
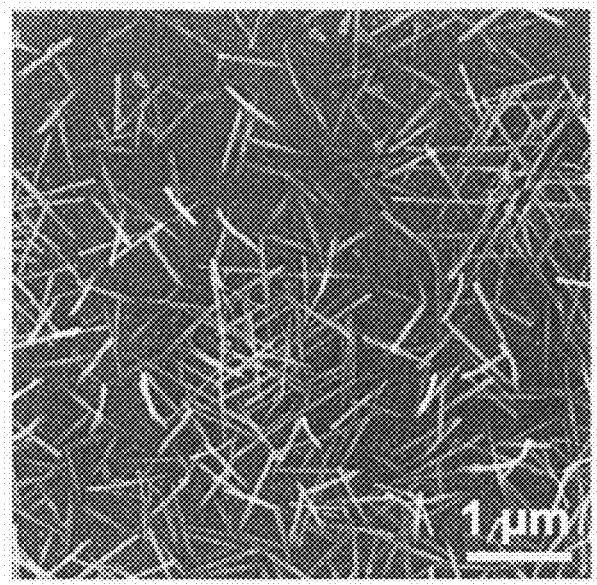
FIG. 37 is an SEM image of a Sample L which was synthesized at 185° C. for 5 hours on a substrate coated four times with a $BiI_3$/ethanol solution.

FIG. 37 is an SEM image of Sample L. Nanowires in Sample L were typically denser than in Samples I-K. However, similar to Samples I-K, nanowires in Sample L typically grew in two-dimensional planar orientations that were substantially parallel to the $BiI_3$ template and to the substrate surface. Nanowires in Sample L tended to form interconnected networks and portions of these networks formed ordered networks with triangular apertures. Nanowires in these ordered triangular networks typically intersected at angles of about 60°. The formation of ordered triangular networks, characterized by nanowires intersecting at 60° angles, may be attributable to the alignment of I⁻ along three equal orientations on the surface of the $BiI_3$ template.

Figure 38:
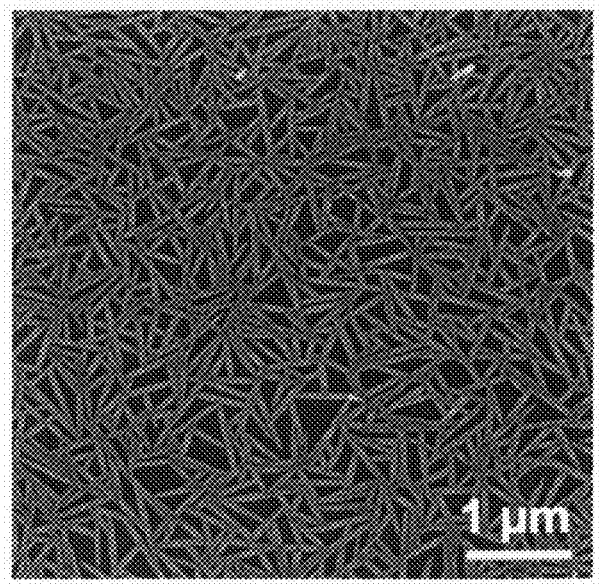
FIG. 38 is an SEM image of a Sample M which was synthesized at 185° C. for 5 hours on a substrate coated five times with a $BiI_3$/ethanol solution.

FIG. 38 is an SEM image of Sample M. Nanowires in Sample M typically formed large networks with a high density of branched nanostructures. Nanowires in Sample M typically had diameters of between about 80 nm and about 100 nm. Nanowires in Sample M were typically thicker than nanowires in Samples I-L.

In general, nanowire diameter and density increased with increased concentration (i.e. more repetitions of coating and drying steps) of $BiI_3$.

Example 7

In an example of $CdS/CdS_xO_{1-x}/CdO$ nanostructure synthesis, a $BiI_3$/ethanol solution was formed by dissolving 1 g $BiI_3$ in 5 ml ethanol. A silicon substrate was then coated with the $BiI_3$/ethanol solution and allowed to dry naturally. The coated substrate was again coated with the $BiI_3$/ethanol solution and allowed to dry and the coating and drying steps repeated until the substrate had been coated a total of three times. A solvent solution was created by adding 0.2 g of $Cd(CH_3COO)_2 \cdot 2H_2O$ to 5 g of $C_{32}H_{66}$. The solvent solution was then heated at about 160° C. for about 2 hours. The coated substrate was introduced into the solvent solution. 0.15 g of sulfur powder was then added to the solvent solution and the sulfur/solvent solution was maintained at a reaction temperature of about 185° C. for a reaction time of about 12 hours. The substrate was then washed in isopropanol at about 160° C. for about 30 minutes and dried at about 200° C. for about 0.5 hours.

Figure 39:
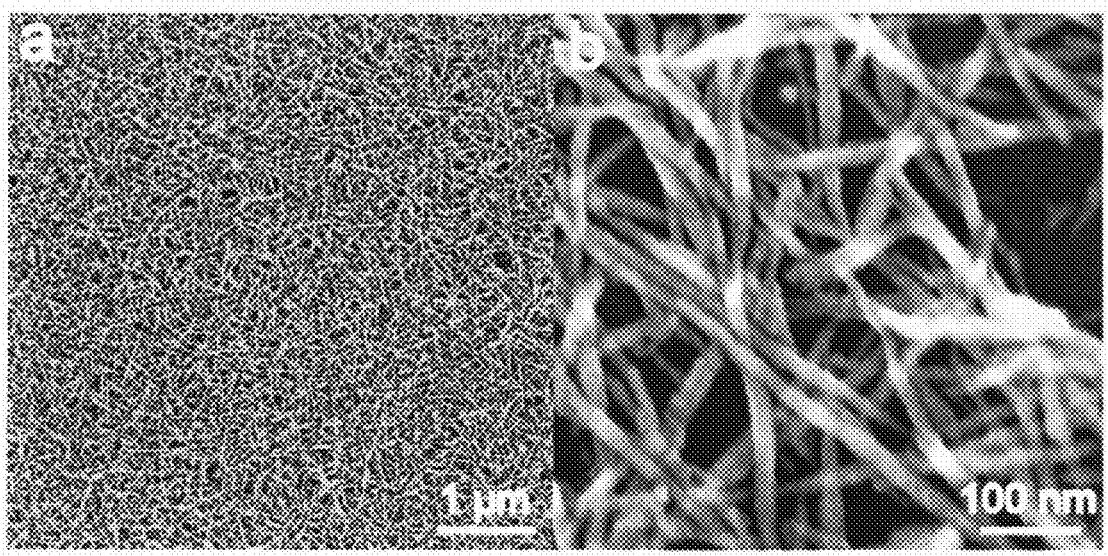
FIG. 39 is (a) a low magnification SEM image and (b) a high magnification SEM image of nanowires synthesized at 185° C. for 12 hours on a substrate coated three times with a $BiI_3$/ethanol solution.

FIG. 39(a) and FIG. 39(b) are low and high magnification SEM images, respectively, of nanostructures synthesized according to this example. Nanowires synthesized according to this example were typically longer and denser than nanowires synthesized similarly but with a shorter reaction time. The high resolution SEM image of FIG. 39(b) shows that the nanowires exhibited a woven pattern and typically the nanowires had diameters between about 20 nm and about 30 nm.

Example 8

In an example of $CdS/CdS_xO_{1-x}/CdO$ nanostructure synthesis, a $BiI_3$/ethanol solution was formed by dissolving 1 g $BiI_3$ in 5 ml ethanol. Silicon substrates were then coated with the $BiI_3$/ethanol solution and allowed to dry naturally. The coated substrates were again coated with the $BiI_3$/ethanol solution and allowed to dry and the coating and drying steps repeated until the substrates had been coated a total of three times. A solvent solution was created by adding 0.2 g of $Cd(CH_3COO)_2 \cdot 2H_2O$ to 5 g of $C_{32}H_{66}$. The solvent solution was then heated at about 160° C. for about 2 hours. The coated substrates were introduced into the solvent solution. Sulfur powder was then added to the solvent solution. Samples N-Q were prepared by varying the amount of sulfur powder added to the solvent solution. To form Sample N, 0.15 g of sulfur powder was added to the solvent solution. To form Sample O, 0.10 g of sulfur powder was added to the solvent solution. To form Sample P, 0.06 g of sulfur powder was added to the solvent solution. To form Sample Q, 0.01 g of sulfur powder was added to the solvent solution. For Samples N-Q, a sulfur/solvent solution was maintained at a reaction temperature of about 185° C. for a reaction time of about 48 hours. Samples N-Q were then washed in isopropanol at about 160° C. for about 30 minutes and dried at about 200° C. for about 0.5 hours.

Figure 40:
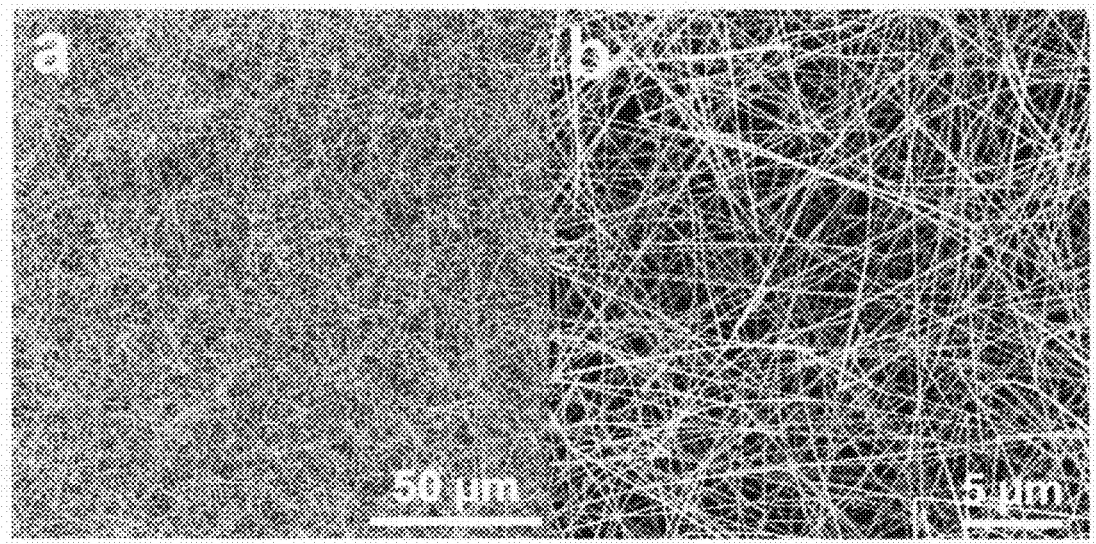
FIG. 40 is (a) a low magnification SEM image and (b) a high magnification SEM image of Sample N which was synthesized at 185° C. for 48 hours with 0.15 g of sulfur powder on a substrate coated three times with a $BiI_3$/ethanol solution.

FIG. 40 includes SEM images of Sample N at increasing magnification. Nanowires in Sample N typically had diameters of between about 60 nm and about 100 nm and lengths of more than 30 μm. Nanowires in Sample N were typically thicker than nanowires in Example 7 which can be at least partially attributed to the longer reaction time of this example compared to that of Example 7. Nanowires in Sample N tended to align along up-down or left-right orientations and formed woven networks. Such networks were typically in a quasi-two-dimensional plane (i.e. exhibiting three-dimensional characteristics with small variation in a third dimension relative to variation in remaining two dimensions) substantially parallel to the substrate. Portions of the woven networks formed suspended square networks.

Figure 41:
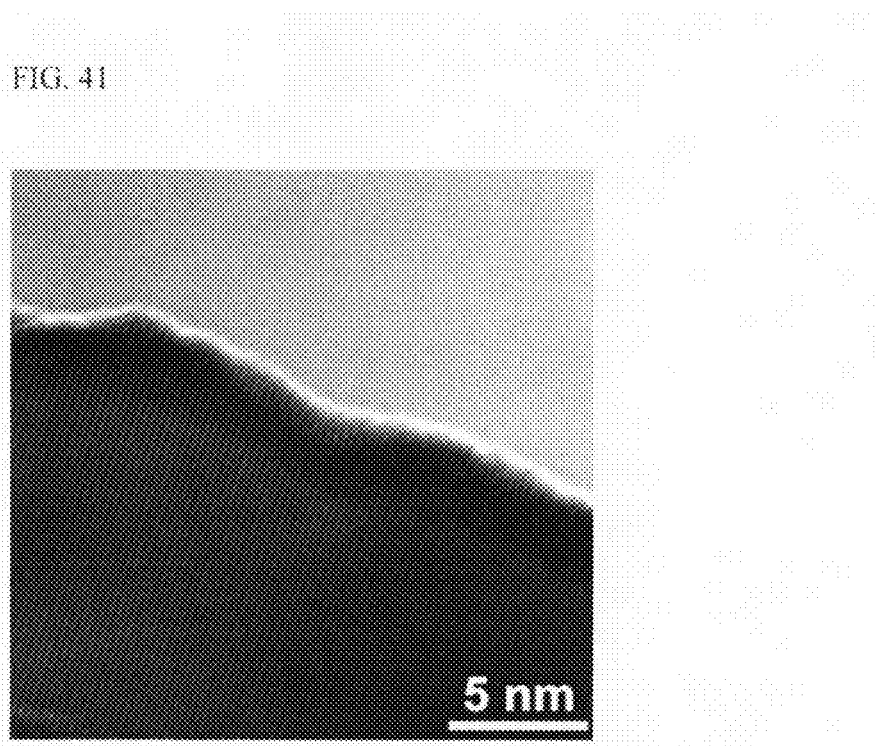
FIG. 41 is a high resolution TEM image of Sample N.

FIG. 41 is an HRTEM image of an edge of a nanowire of Sample N. FIG. 41 is an image of lattice fringes with a lattice spacing of about 0.34 nm, which is consistent with the spacing of (002) planes of hexagonal CdS. These results indicate that the nanowire composition includes CdS.

Figure 42:
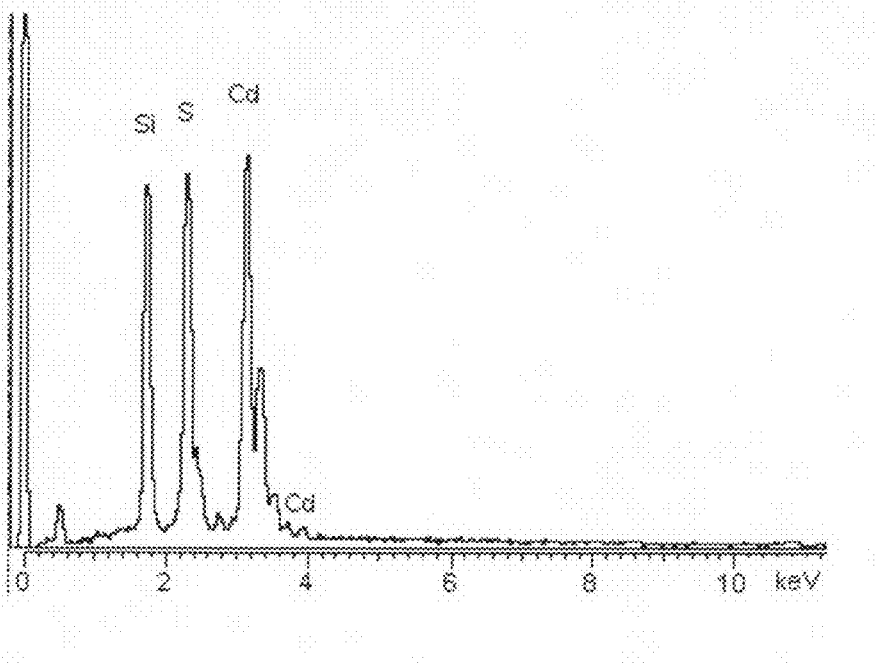
FIG. 42 is an energy dispersive X-ray spectrum of nanowires in Sample N.

FIG. 42 is an EDX spectrum of Sample N. The EDX spectrum demonstrated that the nanowires in Sample N were composed of cadmium and sulfur in atomic percentages of 1.01:1. Therefore, the nanowires in Sample N included CdS nanowires.

Figure 43:
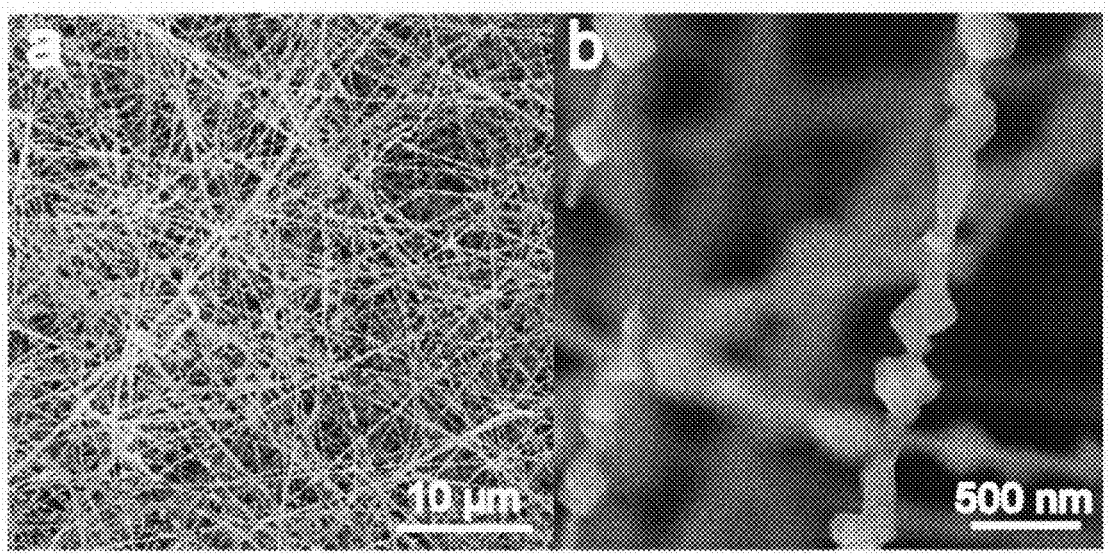
FIG. 43 is (a) a low magnification SEM image and (b) a high magnification SEM image of Sample O which was synthesized at 185° C. for 48 hours with 0.10 g of sulfur powder on a substrate coated three times with a $BiI_3$/ethanol solution.

FIG. 43 is (a) a low magnification SEM image and (b) a high magnification SEM image of Sample O. Nanowires in Sample O were typically straight and formed in a quasi-two-dimensional plane. Nanowires in Sample O included necklace-like nanowires which may be attributed to the growth of nanoparticles with diameters of between about 100 nm and about 200 nm on nanowires with diameters of between about 40 and about 50 nm.

Figure 44:
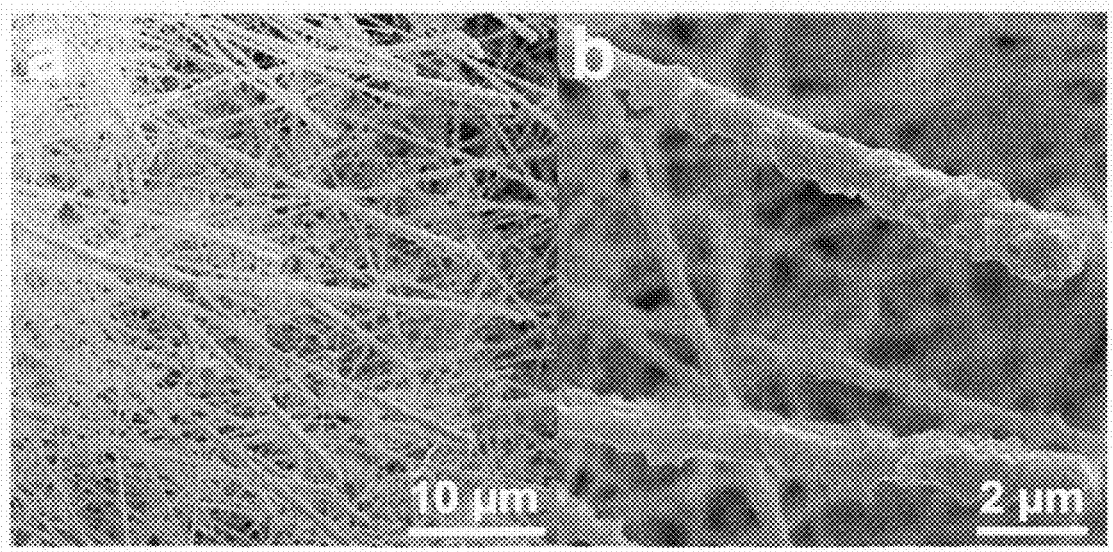
FIG. 44 is (a) a low magnification SEM image and (b) a high magnification SEM image of Sample P which was synthesized at 185° C. for 48 hours with 0.06 g of sulfur powder on a substrate coated three times with a $BiI_3$/ethanol solution.

FIG. 44 is (a) a low magnification SEM image and (b) a high magnification SEM image of Sample P. Nanowires in Sample P typically had diameters of between about 100 nm and about 200 nm. Portions of the nanowires in Sample P grew vertically and had lengths between about 30 μm and about 40 μm. The tips of some nanowires in Sample P had rough surfaces that increased nanowire diameters at the tip to between about 0.5 μm and about 1.5 μm.

Figure 45:
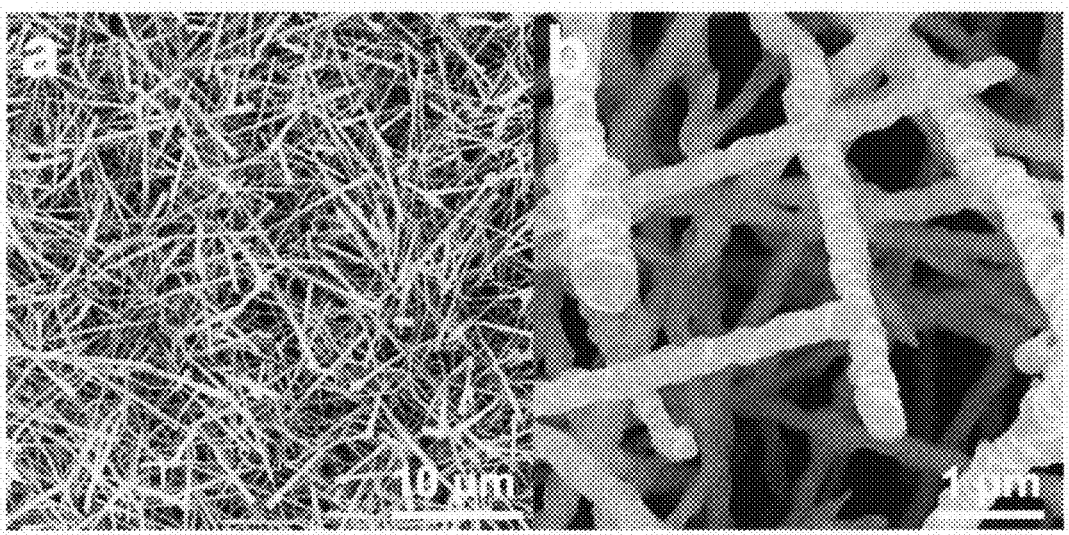
FIG. 45 is (a) a low magnification SEM image and (b) a high magnification SEM image of Sample Q which was synthesized at 185° C. for 48 hours with 0.01 g of sulfur powder on a substrate coated three times with a $BiI_3$/ethanol solution.

FIG. 45 is (a) a low magnification SEM image and (b) a high magnification SEM image of Sample Q. Nanowires in Sample Q grew substantially vertically from the substrate surface (i.e. non-parallel to the substrate surface). Nanowires in Sample Q typically had lengths of about 10 μm and diameters of between about 500 nm and about 700 nm. Nanowires in Sample Q also tended to have coarse surfaces and roots of the nanowires were interconnected. Nanowires in Sample Q were typically shorter than nanowires in Samples N-P.

Figure 46:
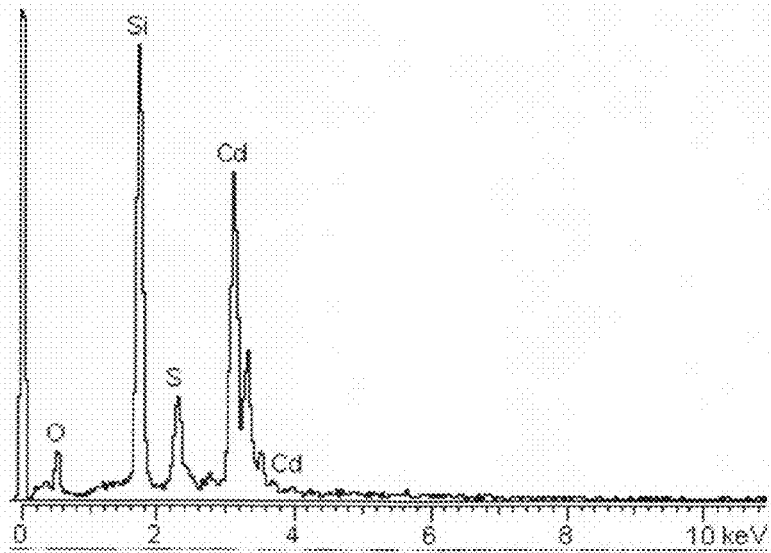
FIG. 46 is an energy dispersive X-ray spectrum of nanowires in Sample Q.

FIG. 46 is an EDX spectrum of Sample Q. The EDX spectrum demonstrates that nanowires in Sample Q were composed of cadmium, sulfur and oxygen with in atomic percentages of 1:0.33:0.67.

Necklace-like nanowires and nanowires with rough surface morphology (i.e. Samples O-Q) may form to enhance stability which can be compromised by low surface free energy of (111) and (100) CdO crystal planes.

In general, in this example, horizontal growth of nanowires was tuned to vertical growth by adjusting the amount of sulfur powder used in nanostructure synthesis. Without limitation to any particular theory, it currently is believed that the change in nanowire growth orientation from horizontal to vertical results from a change in the constituent stoichiometry of the nanowires, which is initiated by adjustment of the sulfur powder concentration during nanowire synthesis. In this example, horizontal growth may be attributable to the crystallization of hexagonal CdS and vertical growth may be attributable to the crystallization of cubic CdO. For Samples N-Q, the addition of sulfur powder to the solvent mixture, as described above, initiated growth of CdS nanostructures or nanowires. When sulfur concentrations during synthesis are low, such as in Samples O-Q, the elongation of CdS nanowires is terminated due to exhaustion of sulfur. Then, CdO growth occurs on the surface of the CdS nanowires, increasing nanowire diameter with increased reaction time. Therefore, a change in nanowire growth from horizontal along the substrate to vertical can be accompanied by a shortening and thickening of the nanowires.

Without limitation to any particular theory, it is currently believed that nanowire growth changes from horizontal to vertical due to the different polarity of S and $O^{2-}$. For example, horizontal growth of CdS nanowires can be aided by electrostatic force between $Cd^{2+}$ and Bi—I bonds on a layered structure template surface, along with alternative deposition of sulfur. Reducing the sulfur powder added to the solvent solution enables strong polar $O^{2-}$ to replace sulfur atoms during reaction. As a consequence, ordered $I^-$ and the disordered $O^{2-}$ compete and the alignment of $Cd^{2+}$ on the $BiI_3$ template is weakened. Because the ability of the $BiI_3$ template to align the depositing nanowires is weakened, growth of $CdS_xO_{1-x}$/CdO nanowires is typically not along the two-dimensional surface of the $BiI_3$ template. $CdS_xO_{1-x}$/CdO nanowires can be grown substantially vertically relative to the template surface. Ordered polar Bi—I bonds on the $BiI_3$ template surface therefore may play an important role in synthesis of two-dimensional nanostructure networks, possibly combining characteristics of soft template (ligands) and hard template (crystal plane) methods.

Example 9

Figure 47:
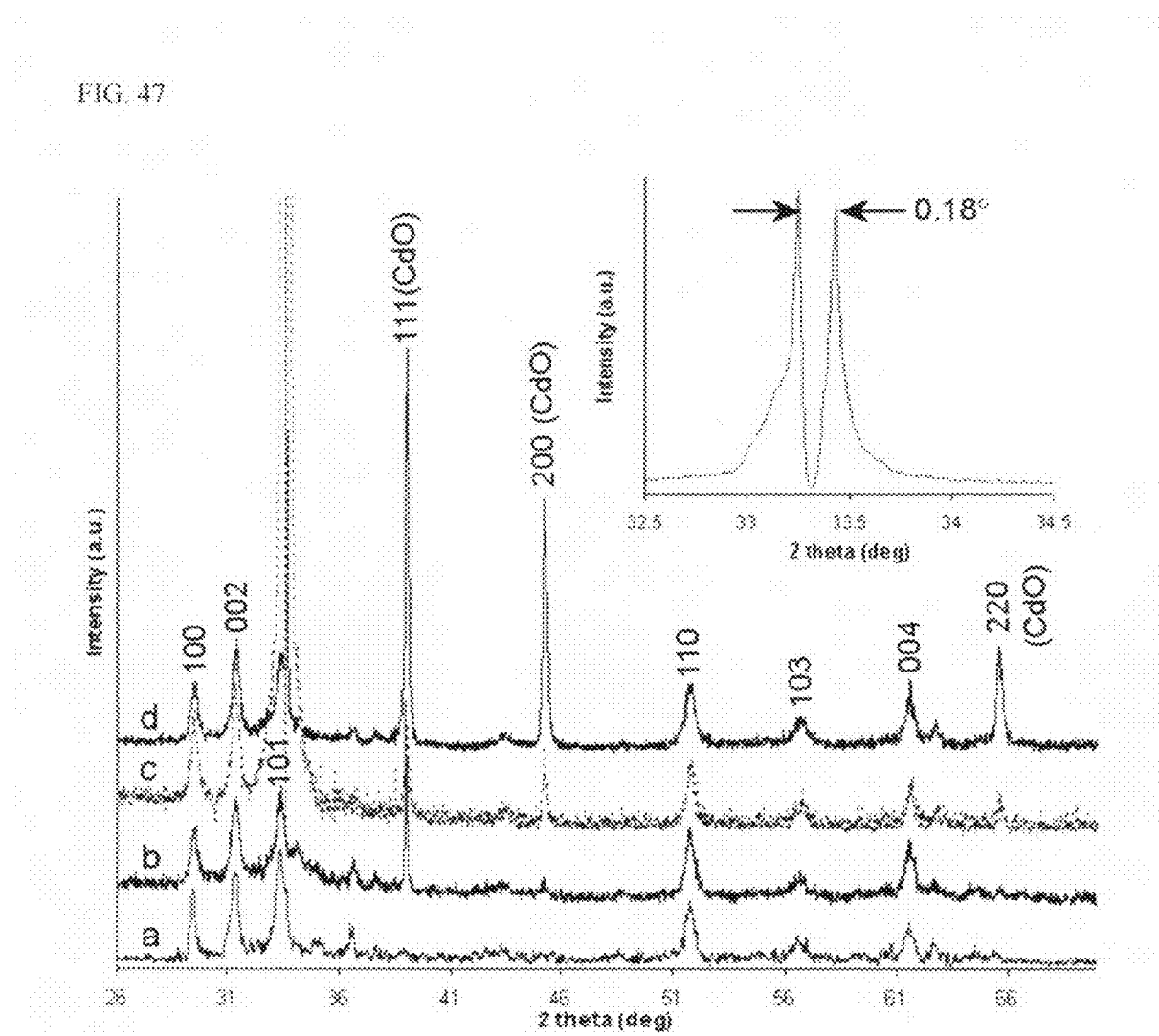
FIG. 47 is X-ray diffraction patterns for Samples N-Q.

X-ray diffraction (XRD) analyses were performed on Samples N-Q and the resulting XRD patterns are shown in FIG. 47. The XRD patterns were recorded with a range of about 25° to about 70° by a Philips X'Pert X-ray diffraction system using Co Kα radiation (λ=1.78897 Å/1.79285 Å) at 40 KV, 30 mA. Patterns a-d in FIG. 47 correspond to Samples N-Q, respectively, and provide indications of how the internal crystal structure of nanostructures can be altered by the concentration of sulfur during the reaction. Diffraction peaks are indexed to the hexagonal phase with lattice constant a=4.14 Å and c=6.72 Å (JCPDS Card No. 41-1049). The diffraction peaks in Pattern a indicate that Sample N includes CdS nanowires. Combined with HRTEM analyses, the (002) peak of Pattern a indicates a preferential orientation of [001] in the CdS nanowires of Sample N.

Pattern b of Sample O exhibits a strong peak at 38.97° and a weak peak at 45.27°, both of which are not apparent in Pattern a. The strong and weak peaks correspond to the (110) and (200) planes, respectively, of cubic CdO crystals with cell constant a=4.6953 Å. A weak peak at 33.50° also appears in Pattern b of FIG. 47. Pattern b indicates a preferential orientation of (111) and (100) in CdO nanowires in Sample O.

In Pattern c of Sample P, peaks at 38.97° and 45.27° appear stronger than in Pattern b of Sample O. In addition, a peak at 65.59° corresponding to (220) planes of CdO crystals is apparent in Pattern c. Strong twin peaks at 33.25° (d=3.13 Å) and 33.43° (d=3.11 Å) also appear in Pattern c which are shown in the high-resolution inset of FIG. 37. In the inset of FIG. 37, an 18° or 0.2 Å separation between the two peaks is indicated. Of the twin diffraction peaks, the 33.25° peak corresponds to (101) planes of CdS hexagonal nanowires and the 33.43° peak corresponds to an interface between a CdS hexagonal nanowire surface and cubic CdO nanocrystals. The separation between these peaks may be attributable to ion radius distinction of $S^{2-}$ (d=1.84 Å) and $O^{2-}$ (d=1.21 Å). Pattern c also indicates a preferential orientation of (111) and (100) in CdO nanowires.

In Pattern d of Sample Q, peaks at 38.99°, 45.27° and 65.65° appeared stronger than in the Patterns of Samples N-P. These three peaks correspond to (111), (200) and (220) planes of CdO crystals, respectively. The twin peaks of Pattern c at 33.25° (d=3.13 Å) and 33.43° (d=3.11 Å) also appeared in Pattern d. However, in Pattern d, the intensity of the peak at 33.25° weakened while the 33.43° peak became sharper and stronger, when compared to Pattern c. As stated, these peaks correspond to CdS and $CdS_xO_{(1-x)}$ lattices, respectively. The weakening of peak 33.25° and strengthening of peak 33.43° observed in Pattern d is indicative of the physical separation between nanowires surfaces covered with CdO nanocrystal and exposed surfaces of the nanowires.

Without limitation to any particular theory, it currently is believed that the constituent stoichiometry of synthesized nanowires can be tuned by adjusting the amount of a second precursor that is added to a first precursor/solvent solution during synthesis. For example, based on Vegard's law, observed variation in intensity of diffraction peaks (111), (200) and (220) across Samples N-Q indicates that the proportion of CdO relative to CdS increases as the amount of sulfur powder added during synthesis is reduced. Observed twin diffraction peaks can be attributed to CdO growth on the surface of high aspect ratio CdS nanowires. Such growth can lead to uniform replacement of $S^{2-}$ with $O^{2-}$ along the CdS nanowire surface. In addition, the twin peaks in Pattern d also suggest that nanowires with a $CdS/CdS_xO_{1-x}$/CdO (core/interface/surface) coaxial structure form as a result of sulfur deprivation during nanostructure synthesis.

Example 10

The optical properties of Samples N-Q were observed by measuring photoluminescence (PL) emission at different temperatures. PL measurements were carried out at 6-300 K using a He—Cd laser with a wavelength of 325 nm (30 mW) as the excitation source. PL properties of Samples N-Q were shown to vary based on variation in internal structure and constituent stoichiometry of Samples N-Q.

FIG. 48 shows normalized photoluminescence spectra for Samples N-Q at (a) 300 K and at (b) 6 K. Samples N-Q were used to obtain spectra S1, S2, S3, and S4, respectively, in FIGS. 48(a) and (b). At 300 K, the CdS nanowires of Sample N exhibited a relatively sharp emission peak at 506 nm (2.45 eV) with a full width half-maximum (FWHM) of 32 nm. This peak is near the absorption band edge.

At 300 K, Sample O exhibited an emission peak at about 507 nm with a FWHM of 36 nm. This peak is at a similar location to the emission peak of Sample N. Sample O also exhibited a wide emission peak at 690 nm (1.80 eV) with a FWHM of 110 nm. This peak appears much stronger than the peak at this location in the spectrum of Sample O. The strength of this peak in the spectrum of Sample O may be attributable to structural defects or impurities. A weak peak at around 550 nm also appears in the spectrum of Sample O. Emission peaks from Sample O suggest the coexistence of the hexagonal (i.e. CdS) and cubic (i.e. CdO) structure in the nanostructures of Sample O. PL spectra of Sample O also demonstrated simultaneous propagation of two light beams at 492 nm and at 532 nm, which are emitted from CdS nanowires and CdO nanostructures, respectively.

At 300 K, Sample P exhibits two emission peaks at 509 nm (2.44 eV) and at 529 nm (2.34 eV). Similar to Sample O, emission peaks from Sample P suggest the coexistence of the hexagonal (i.e. CdS) and cubic (i.e. CdO) structure in the nanostructures of Sample P. At 300 K, Sample Q exhibits a wide emission peak at 543 nm (2.28 eV) with a FWHM of 75 nm. This peak may be attributable to emission from CdO nanowires in Sample Q.

At 6 K, the emission peaks observed at 300 K for Samples N-Q are enhanced observably. It is therefore made more apparent by FIG. 48 (b) that the peak emission wavelength is shifted based on changes in the concentration of sulfur powder in Samples N-Q. Specifically, the emission peak shifts from about 516 nm observed with Sample N to about 533 nm observed with Sample Q.

At 6 K, Sample O also exhibits a wide compound peak which includes a weak emission at 492 nm and a strong emission at 532 nm. Similarly, Sample P exhibits a compound peak including two strong emissions at 520 nm and 533 nm. Spectra for Sample P and Sample Q can be characterized as relatively smooth curves while spectra for Sample N and Sample O exhibit oscillations, or raw emissions. These oscillations can be attributed to longitudinal modes of Fabry-Perot subwavelength cavities created by the nanowires.

Figure 49:
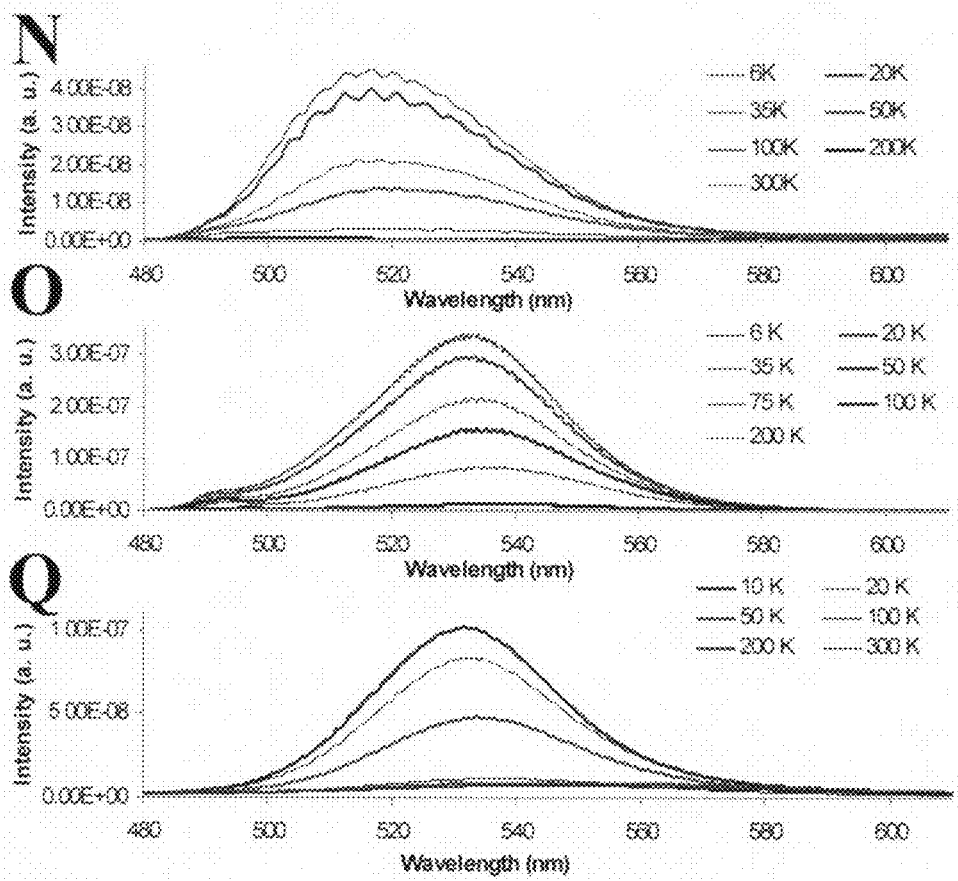
FIG. 49 is normalized photoluminescence spectra of Samples N, O and Q over a range of temperatures.

FIG. 49 shows normalized PL spectra of Samples N, O and Q over a range of temperatures. In general, FIG. 49 demonstrates that the PL intensity decreases with increased temperature. For example, PL emissions at 6 K exhibit the highest PL intensities compared to emissions at 20 K, 35 K, 50 K, 100 K, 200 K, and 300 K for Samples N, O, and Q.

Figure 50:
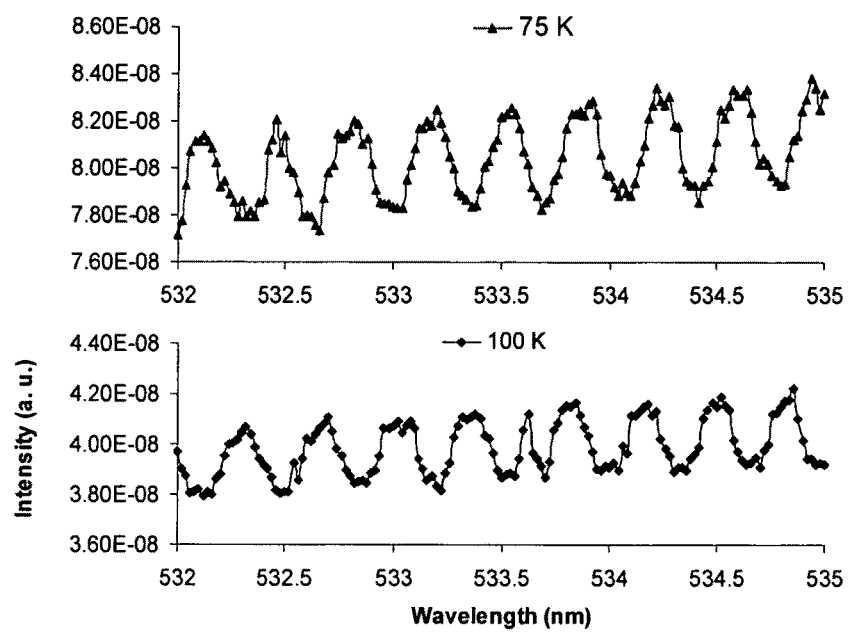
FIG. 50 is high resolution photoluminescence spectra of Sample O at 75 K and at 100 K.

FIG. 50 shows high resolution PL spectra of Sample O at 75 K and at 100 K. Periodic variation in the PL intensity is evident in these high resolution spectra. The period of such variations was shown to be about 4 nm and about 0.6 nm for Sample N and Sample O, respectively. A cavity size can be determined from these periods based on the following formula: $\Delta\lambda=(\lambda^2/2L)\,(n_1-\lambda(dn_1/d\lambda))^{-1}$, where L, $\Delta\lambda$, and $dn_1/d\lambda$ are the cavity length, the mode spacing, and the dispersion relation for the refractive index, respectively. Fabry-Perot cavity lengths for Sample N and for Sample O were calculated to be 8 µm and 58.8 um, respectively.

The calculated Fabry-Perot cavity length for Sample N is shorter than lengths of CdS nanowires observed in SEM images of Sample N. However, the calculated Fabry-Perot cavity length for Sample N is similar to distances between two parallel CdS nanowires, as observed in SEM images of Sample N. This comparison indicates that the length of the Fabry-Perot cavity may be shortened by the formation of networks. In a network, intersecting nanowires can act as coupled waveguides which subsequently broadens the emission peak of Sample N.

The calculated Fabry-Perot cavity length for Sample O appears to match with lengths of $CdS/CdS_xO_{1-x}/CdO$ nanowires observed in SEM images of Sample O.

In general, the narrow excitonic emissions with insignificant long wavelength emission observed in this example indicate that Samples N-Q include nanowires of high crystalline quality. This example also demonstrates tunable PL emission with Fabry-Perot modes, wherein Fabry-Perot subwavelength cavities are formed from a single or from a couple of uniform, high yield CdS or $CdS/CdS_xO_{1-x}/CdO$ nanowires. Woven nanowires performed as large scale Fabry-Perot subwavelength cavities with multi-channel propagations.

Adjustments to the CdS nanowire growth through formation of ternary $CdS/CdS_xO_{1-x}/CdO$ structures are also reflected by the modulated shifts of PL peaks in the spectral range from 506 nm (CdS) to 543 nm (CdO) at 300 K and from 516 nm (CdS) to 533 nm (CdO) at 6 K. The band gap of $CdS_xO_{1-x}$ narrows with increased $O^{2-}$ doping of the CdS nanowires and can be tuned by minimizing the concentration of sulfur powder. It is currently believed, based on XRD and PL analysis of Sample O and Sample P, that a two-step growth process is occurring. This two-step process comprises CdS nanowire growth and CdO nanocrystal growth in response to minimizing the concentration of sulfur powder.

In view of the many possible embodiments to which the disclosed principles may be applied, it should be recognized that the illustrated embodiments are only examples and should not be taken as limiting the scope of the disclosure. We claim all that comes within the scope and spirit of the appended claims.

We claim:

1. A method for synthesizing a plurality of nanowires comprising CdX, wherein X is S or Se; bismuth in an atomic percentage that is between about 5% and about 20%; and iodide in an atomic percentage that is between about 3% and about 10%, the method comprising:
    depositing $BiI_3$ on a substrate;
    contacting the substrate with a non-polar organic solvent and a first nanowire precursor selected from $Cd(OAc)_2$, $Cd(Cl)_2$, $Cd(NO_3)_2$, or $CdSO_4$; and
    contacting the substrate with a second nanowire precursor selected from sulfur or selenium.

2. The method according to claim 1, wherein the plurality of nanowires from an ordered pattern.

3. The method according to claim 1, wherein synthesizing the plurality of nanowires is carried out at atmospheric pressure.

4. The method according to claim 1, wherein the $BiI_3$ nucleates growth of the plurality of nanowires.

5. The method according to claim 1, wherein depositing $BiI_3$ on the substrate comprises:
    forming $BiI_3$ flakes in a supersaturated solution thereby forming a supersaturated solution containing $BiI_3$ flakes; and
    transferring a portion of the supersaturated solution containing $BiI_3$ flakes to the substrate surface.

6. The method according to claim 1, wherein the plurality of nanowires are substantially uniform in diameter.

7. The method according to claim 1, wherein the plurality of nanowires are substantially single crystal nanowires.

8. The method according to claim 1, wherein a portion of the plurality of nanowires intersect at points of intersection to form a nanowire network.

9. The method according to claim 8, wherein the portion of the plurality of nanowires that intersect at points of intersection forms covalent bonds at the points of intersection.

10. The method according to claim 8, wherein the portion of the plurality of nanowires that intersect at points of intersection forms substantially 90° angles at the points of intersection.

11. The method according to claim 8, wherein the portion of the plurality of nanowires that intersect at points of intersection is synthesized at substantially the same time.

12. The method according to claim 1, wherein the plurality of nanowires have an average diameter between about 20 nm and about 60 nm.

13. The method according to claim 1, wherein the plurality of nanowires are substantially straight.

14. A method, comprising:
providing a plurality of nanowires comprising CdX, wherein X is S or Se; bismuth in an atomic percentage that is between about 5% and about 20%; and iodide in an atomic percentage that is between about 3% and about 10%; and
removing at least a portion of a nanowire.

15. The method of claim 14, wherein the plurality of nanowires form a nanowire network and wherein removing at least a portion of a nanowire includes removing a portion of the nanowire network.

16. The method of claim 14, further comprising annealing the nanowires.

17. The method of claim 14, further comprising doping at least a portion of the plurality of nanowires.

18. The method of claim 14, further comprising electrically coupling at least one nanowire to an electrode.

19. The method of claim 14, wherein removing at least a portion of a nanowire is accomplished through methods of micro-machining.

20. An ordered, planar network of nanostructures, comprising:
a plurality of nanowires intersecting at a plurality of intersection points that are parallel to, and within the plane, of a substrate, wherein the plurality of nanowires are substantially a single crystalline structure and wherein the nanowires comprise CdX, wherein X is S or Se; bismuth in an atomic percentage that is between about 5% and about 20%; and iodide in an atomic percentage that is between about 3% and about 10%; and
wherein intersecting nanowires are covalently bonded at intersection points.

21. The ordered, planar network of nanostructures according to claim 20, wherein the intersecting nanowires intersect at angles that are substantially 90°.

22. The ordered, planar network of nanostructures according to claim 20, wherein the nanowires are substantially straight.

23. The ordered, planar network of nanostructures according to claim 20, wherein the nanowires are substantially uniform.

24. The ordered, planar network of nanostructures according to claim 20, wherein the plurality of nanowires is a first plurality of nanowires forming a first nanowire network layer, further comprising:
a second nanowire network layer comprising a second plurality of nanowires that are substantially a single crystalline structure and substantially simultaneously synthesized with the first nanowire network; and
wherein intersecting nanowires in the second nanowire network layer are covalently bonded at intersection points creating a substantially 90° angle.

25. A nanowire, comprising:
CdX, wherein X is S or Se;
bismuth in an atomic percentage that is between about 5% and about 20%; and
iodide in an atomic percentage that is between about 3% and about 10%.

26. A nanowire network formed from a plurality of nanowires according to claim 25.

27. An ordered, planar network of nanostructures, comprising:
a plurality of nanowires intersecting at a plurality of or substantially 30° intersection points that are parallel to, and within the plane of, a substrate, wherein the plurality of nanowires are substantially a single crystalline structure and wherein the nanowires comprise CdX, wherein X is S or Se; bismuth in an atomic percentage that is between about 5% and about 20%; and iodide in an atomic percentage that is between about 3% and about 10%; and
wherein intersecting nanowires are covalently bonded at intersection points.

* * * * *